US012683436B2

(12) United States Patent
Hu et al.

(10) Patent No.: US 12,683,436 B2
(45) Date of Patent: Jul. 14, 2026

(54) FRIENDLY METAL LOSS ESTIMATION FOR WIRELESS POWER TRANSFER

(71) Applicant: Apple Inc., Cupertino, CA (US)

(72) Inventors: Zhiyuan Hu, Santa Clara, CA (US); Zhao Yuan, San Jose, CA (US); Adam L Schwartz, Redwood City, CA (US); Arash Mehrabi, Menlo Park, CA (US); Brandon Russel Marian Pais, Auckland (NZ); Jizhen Fu, San Jose, CA (US); Shubha Ramakrishnan, San Jose, CA (US); Wynand Malan, Auckland (NZ)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 19/088,356

(22) Filed: Mar. 24, 2025

(65) Prior Publication Data

US 2025/0330051 A1      Oct. 23, 2025

Related U.S. Application Data

(60) Provisional application No. 63/637,184, filed on Apr. 22, 2024.

(51) Int. Cl.
*H02J 50/80*      (2016.01)
*H02J 50/12*      (2016.01)
*G01R 27/26*      (2006.01)

(52) U.S. Cl.
CPC ............. *H02J 50/80* (2016.02); *H02J 50/12* (2016.02); *G01R 27/2688* (2013.01)

(58) Field of Classification Search
CPC ...... H02J 50/80; H02J 50/12; G01R 27/2688; G01R 27/26
See application file for complete search history.

(56) References Cited

U.S. PATENT DOCUMENTS 11,916,406 B1      2/2024  Malan et al.
2012/0077537 A1    3/2012  Muratov et al.
(Continued)

FOREIGN PATENT DOCUMENTS

GB      2635815 A      5/2025
JP      2013541313 A   11/2013
JP      2016531538 A   10/2016

OTHER PUBLICATIONS

U.S. Appl. No. 18/617,103, filed Mar. 26, 2024, Ramakrishnan et al.

*Primary Examiner* — Robert L Deberadinis
(74) *Attorney, Agent, or Firm* — FLETCHER YODER PC

(57)      ABSTRACT

A method for estimating friendly metal losses associated with wireless power transfer from a wireless power transmitter to a wireless power receiver can include obtaining an indication of received power including rectifier voltage and rectifier current of the wireless power receiver and computing a friendly metal power loss based on the indication of rectifier voltage and rectifier current of the wireless power receiver and one or more coefficients corresponding to a baseline wireless power transmission between the wireless power transmitter and the wireless power receiver. The rectifier voltage can be a rectifier output voltage, and the rectifier current can be a rectifier output current. Computing the friendly metal power loss can use an equation having a form $$P_{loss} = a \cdot I_{TX}^2 + b \cdot I_{rect}^2 + c \cdot V_{rect}^2,$$

where b is a coefficient relating to the rectifier current, c is a coefficient relating to the rectifier voltage, a is a coefficient relating to transmitter current $I_{TX}$.

19 Claims, 9 Drawing Sheets

(56) References Cited

U.S. PATENT DOCUMENTS

| | | |
|---|---|---|
| 2016/0149440 A1 | 5/2016 | Staring et al. |
| 2020/0169123 A1 | 5/2020 | Mehas et al. |
| 2022/0320911 A1 | 10/2022 | Schwartz et al. |
| 2024/0106280 A1 | 3/2024 | Ramakrishnan et al. |
| 2025/0088038 A1 | 3/2025 | Pinto et al. |

FIG. 2A                    FIG. 2B                    FIG. 2C

From Fig. 2A ignore $R_{ext,loss}$ $R_{ext,loss}$~0.17; $R_s$~17.5

$\omega L_{mf}$~300 (2.2); $R_m$~2 (0.0)

$\omega L_{m}^2$~7; $(1/\omega C)$~0.6 (0.0)

$$P(RM) = \frac{\frac{z_s^2}{s}R_m}{(\omega L_{ms})^2}V_{ms}^2 + \frac{\frac{z_s^2}{s}R_m(\omega L_{ms2} - \frac{1}{\omega C_{ms}})^2}{(\omega L_{ms})^2}I_{ms}^2$$

$\nearrow$ 203

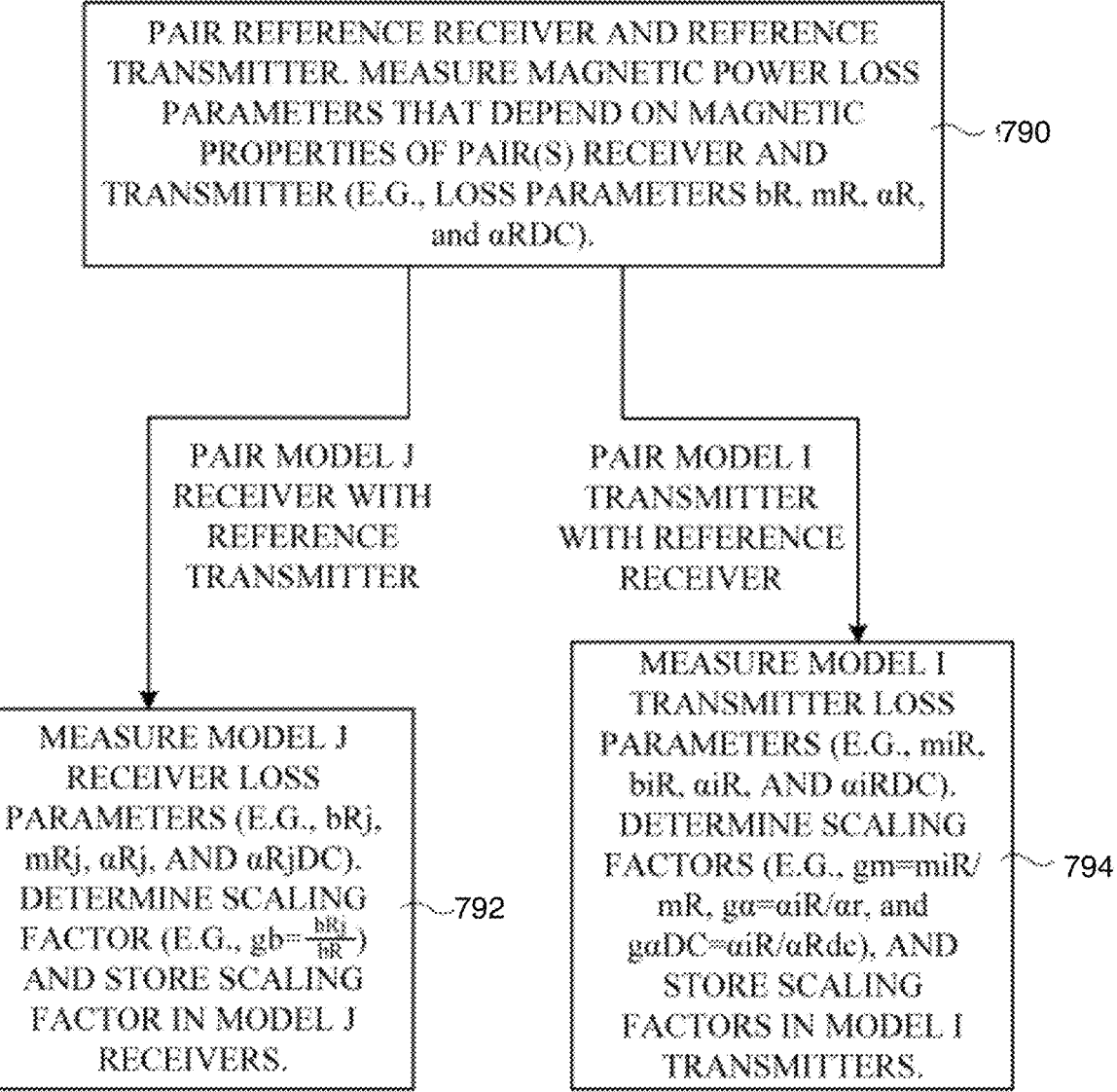

PAIR REFERENCE RECEIVER AND REFERENCE TRANSMITTER. MEASURE MAGNETIC POWER LOSS PARAMETERS THAT DEPEND ON MAGNETIC PROPERTIES OF PAIR(S) RECEIVER AND TRANSMITTER (E.G., LOSS PARAMETERS bR, mR, αR, and αRDC). ~790

PAIR MODEL J RECEIVER WITH REFERENCE TRANSMITTER

PAIR MODEL I TRANSMITTER WITH REFERENCE RECEIVER

MEASURE MODEL J RECEIVER LOSS PARAMETERS (E.G., bRj, mRj, αRj, AND αRjDC). DETERMINE SCALING FACTOR (E.G., $gb = \frac{bRj}{bR}$) AND STORE SCALING FACTOR IN MODEL J RECEIVERS. ~792

MEASURE MODEL I TRANSMITTER LOSS PARAMETERS (E.G., miR, biR, αiR, AND αiRDC). DETERMINE SCALING FACTORS (E.G., gm=miR/mR, gα=αiR/αr, and gαDC=αiR/αRdc), AND STORE SCALING FACTORS IN MODEL I TRANSMITTERS. ~794

Fig. 7

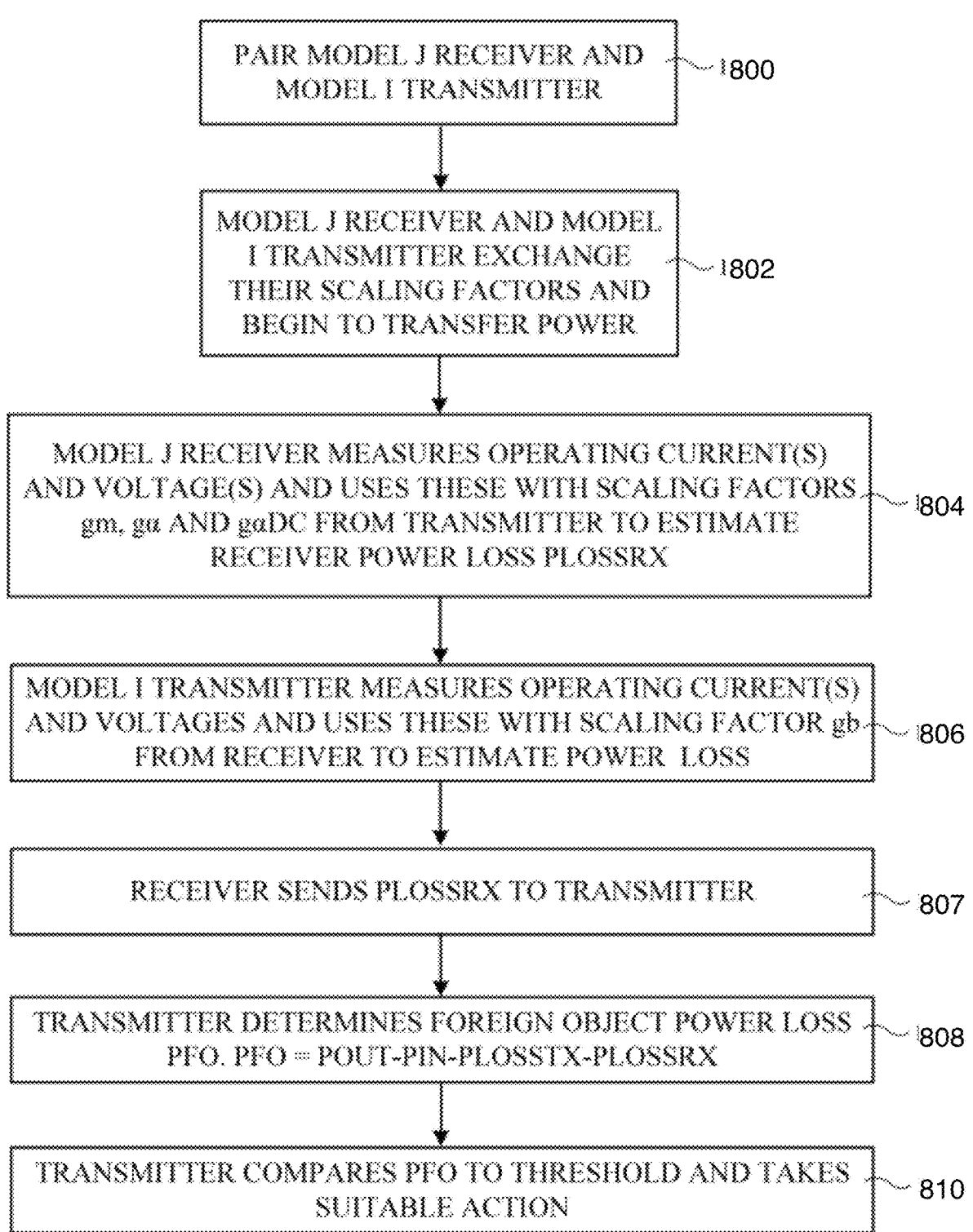

PAIR MODEL J RECEIVER AND MODEL I TRANSMITTER ~ 800

MODEL J RECEIVER AND MODEL I TRANSMITTER EXCHANGE THEIR SCALING FACTORS AND BEGIN TO TRANSFER POWER ~ 802

MODEL J RECEIVER MEASURES OPERATING CURRENT(S) AND VOLTAGE(S) AND USES THESE WITH SCALING FACTORS gm, ga AND gaDC FROM TRANSMITTER TO ESTIMATE RECEIVER POWER LOSS PLOSSRX ~ 804

MODEL I TRANSMITTER MEASURES OPERATING CURRENT(S) AND VOLTAGES AND USES THESE WITH SCALING FACTOR gb FROM RECEIVER TO ESTIMATE POWER LOSS ~ 806

RECEIVER SENDS PLOSSRX TO TRANSMITTER ~ 807

TRANSMITTER DETERMINES FOREIGN OBJECT POWER LOSS PFO. PFO = POUT-PIN-PLOSSTX-PLOSSRX ~ 808

TRANSMITTER COMPARES PFO TO THRESHOLD AND TAKES SUITABLE ACTION ~ 810

Fig. 8

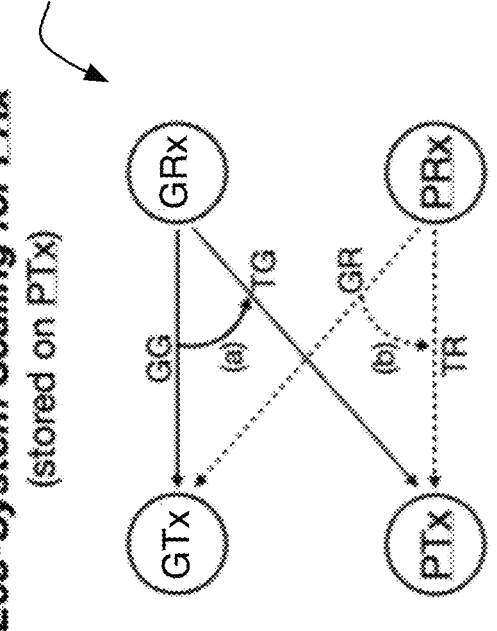
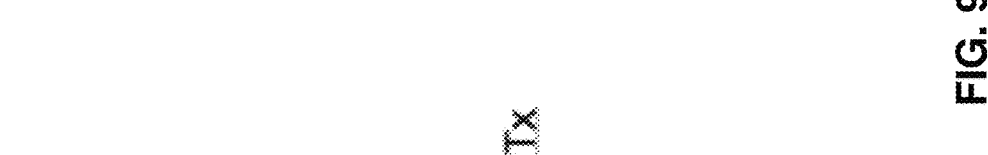
FIG. 9

1000

| | Friendly Metal Loss Variables | | | |
|---|---|---|---|---|
| DC | ITX$^2$ | IRECT$^2$ | VIN$^2$ | VRECT$^2$ |
| | X | X | | X |
| X | X | X | | |
| X | X | X | | X |
| X | X | | | X |
| | X | | | X |
| X | X | | | |
| X | X | | X | |
| X | | X | | X |
| | | X | | X |
| | X | X | X | |
| | X | | X | X |

1041
1042
1043
1044
1045
1046
1047
1048
1049
1050
1051

FRIENDLY METAL LOSS ESTIMATION FOR WIRELESS POWER TRANSFER

BACKGROUND

Wireless power transfer is used in various electronic devices. For example, smart phones, tablet computers, smart watches, wireless earphones, styluses, etc. may employ wireless power transfer to facilitate charging of batteries within the devices. In some application, higher levels of wireless power transfer may be desired, for example to provide for faster charging. Such higher power transfer levels can benefit from techniques to improve estimation of losses, including losses associated with "friendly metal" associated with a wireless power transmitter and/or wireless power receiver device.

SUMMARY

A wireless power transmitter can include a wireless power transfer coil configured to magnetically couple to a wireless power transfer coil of a wireless power receiver to wirelessly transfer power to the wireless power receiver; an inverter configured to receive input power and generate an output that drives the wireless power transfer coil; and controller and communication circuitry coupled to the inverter and the wireless power transfer coil that controls the inverter to regulate wireless power transfer to the wireless power receiver, wherein the controller and communication circuitry that estimates a friendly metal loss associated with wireless power transfer to the wireless power receiver by: receiving from the wireless power receiver an indication of received power including rectifier voltage and rectifier current of the wireless power receiver associated with the wireless power transfer; computing a friendly metal power loss based on the received rectifier voltage and received rectifier current of the wireless power receiver and one or more coefficients corresponding to a baseline wireless power transmission between the wireless power transmitter and the wireless power receiver; and regulating wireless power transfer to the wireless power receiver using the friendly metal power loss.

The rectifier voltage can be a rectifier output voltage, and the rectifier current can be a rectifier output current. The one or more coefficients corresponding to the baseline wireless power transmission between the wireless power transmitter and the wireless power receiver can have been derived by performing a regression analysis on a received plurality of indications of received power including or derived from corresponding rectifier voltages and rectifier currents of another wireless power receiver associated with another wireless power transfer and a determined plurality of measured power loss values derived therefrom to compute the one or more coefficients. The one or more coefficients can include a first coefficient relating to the rectifier current and a second coefficient relating to the rectifier voltage.

Computing the friendly metal power loss can use an equation having a form:

$$P_{loss} = a \cdot I_{TX}^2 + b \cdot I_{rect}^2 + c \cdot V_{rect}^2$$

where b is the first coefficient relating to the rectifier current, c is the second coefficient relating to the rectifier voltage, a is a coefficient relating to transmitter current, and ITX is the transmitter current.

The controller and communication circuitry can estimate the friendly metal loss by further receiving one or more power loss scaling factors from the wireless power receiver and computing the friendly metal power loss responsive to the one or more power loss scaling factors, wherein the one or more power loss scaling factors are based on pairing between a reference wireless power transmitter or wireless power receiver and an actual wireless power transmitter or wireless power receiver.

The controller and communication circuitry can estimate the friendly metal loss by further receiving one or more power loss scaling factors from the wireless power receiver and computing the friendly metal power loss responsive to the one or more power loss scaling factors, wherein the one or more power loss scaling factors are based on pairing between a reference wireless power transmitter or wireless power receiver and an actual wireless power transmitter or wireless power receiver.

A method performed by control circuitry of a wireless power transmitter or a wireless power receiver for estimating friendly metal losses associated with wireless power transfer from the wireless power transmitter to a wireless power receiver can include: obtaining an indication of received power including rectifier voltage and rectifier current of the wireless power receiver; and computing a friendly metal power loss based on the indication of rectifier voltage and rectifier current of the wireless power receiver and one or more coefficients corresponding to a baseline wireless power transmission between the wireless power transmitter and the wireless power receiver; and regulating wireless power transfer using the friendly metal power loss; wherein: the rectifier voltage is a rectifier output voltage, and the rectifier current is a rectifier output current; and computing the friendly metal power loss uses an equation having a form:

$$P_{loss} = a \cdot I_{TX}^2 + b \cdot I_{rect}^2 + c \cdot V_{rect}^2$$

where b is a first coefficient relating to the rectifier current, c is a second coefficient relating to the rectifier voltage, a is a coefficient relating to transmitter current, and ITX is the transmitter current.

The rectifier voltage can be a rectifier output voltage, and the rectifier current can be a rectifier output current. The one or more coefficients corresponding to the baseline wireless power transmission between the wireless power transmitter and the wireless power receiver can have been derived by performing a regression analysis on a received plurality of indications of received power and corresponding rectifier voltages and rectifier currents of another wireless power receiver associated with another wireless power transfer and a determined plurality of measured power loss values derived therefrom to compute the one or more coefficients.

The method can further include receiving one or more power loss scaling factors from the wireless power receiver, wherein computing the friendly metal power loss can be based on the one or more power loss scaling factors, wherein the one or more power loss scaling factors are based on pairing between a reference wireless power transmitter or wireless power receiver and an actual wireless power transmitter or wireless power receiver.

A wireless power transmitter can include a wireless power transfer coil configured to magnetically couple to a wireless power transfer coil of a wireless power receiver to wirelessly transfer power to the wireless power receiver; an inverter configured to receive input power and generate an output that drives the wireless power transfer coil; and controller and communication circuitry coupled to the inverter and the wireless power transfer coil that controls the inverter to regulate wireless power transfer to the wireless power receiver. The controller and communication circuitry can estimate a friendly metal loss associated with wireless power transfer to the wireless power receiver by receiving from the wireless power receiver an indication of received power including rectifier voltage and rectifier current of the wireless power receiver; computing a friendly metal power loss based on the rectifier voltage and rectifier current of the wireless power receiver and one or more coefficients corresponding to a baseline wireless power transmission between the wireless power transmitter and the wireless power receiver; and regulating wireless power transfer to the wireless power receiver using the friendly metal power loss. The rectifier voltage can be a rectifier output voltage, and the rectifier current can be a rectifier output current. Computing the friendly metal power loss can use an equation having a form:

$$P_{loss} = a \cdot I_{TX}^2 + b \cdot I_{rect}^2 + c \cdot V_{rect}^2$$

where b is a first coefficient relating to the rectifier current, c is a second coefficient relating to the rectifier voltage, a is a coefficient relating to transmitter current, and ITX is the transmitter current.

The one or more coefficients corresponding to the baseline wireless power transmission between the wireless power transmitter and another wireless power receiver can have been derived by performing a regression analysis on a received plurality of indications of received power including or derived from corresponding rectifier voltages and rectifier currents of another wireless power receiver associated with another wireless power transfer and a determined plurality of measured power loss values derived therefrom to compute the one or more coefficients. The controller and communication circuitry can estimate the friendly metal loss by further receiving one or more power loss scaling factors from the wireless power receiver and computing the friendly metal power loss responsive to the one or more power loss scaling factors, wherein the one or more power loss scaling factors are based on pairing between a reference wireless power transmitter or wireless power receiver and an actual wireless power transmitter or wireless power receiver.

BRIEF DESCRIPTION OF THE DRAWINGS

FIGS. 2A-2C illustrate various configurations of a wireless power transfer system.

FIG. 7 is a flow chart of illustrative operations associated with using devices in wireless power systems in accordance with embodiments.

FIG. 8 is a flow chart of illustrative operations associated with using devices in wireless power systems in accordance with embodiments.

FIG. 9 illustrates aspects of an ecosystem scaling arrangement for a wireless power transfer system.

DETAILED DESCRIPTION

Figure 1:
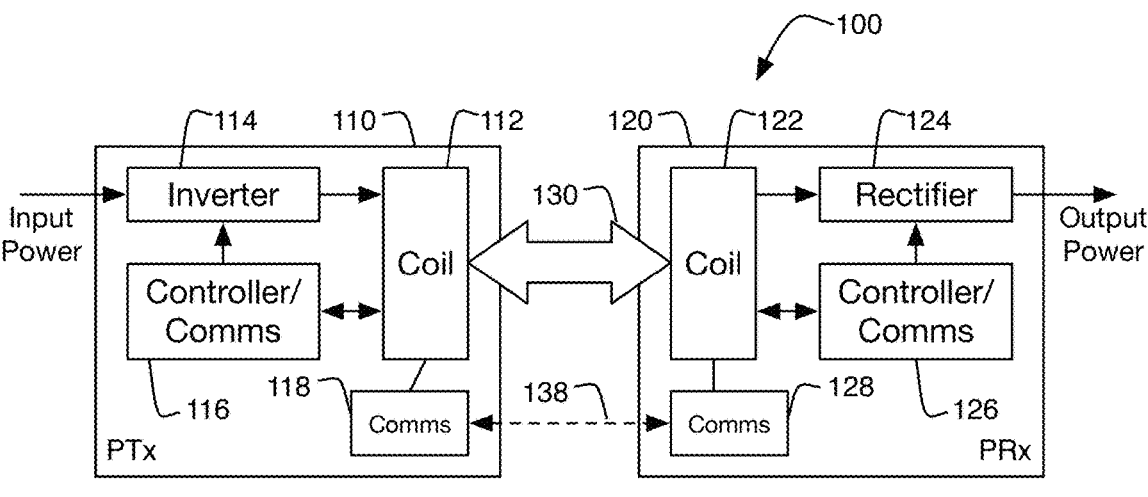
FIG. 1 illustrates a simplified block diagram of a wireless power transfer system.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth to provide a thorough understanding of the implementations described herein. In other instances, methods, procedures, and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

Wireless Power Transfer

FIG. 1 illustrates a simplified block diagram of a wireless power transfer system 100. Wireless power transfer system includes a power transmitter (PTx) 110 that transfers power to a power receiver (PRx) 120 wirelessly, such as via inductive coupling 130. Power transmitter 110 may receive input power that is converted to an AC voltage having particular voltage and frequency characteristics by an inverter 114. Inverter 114 may be controlled by a controller/communications module 116 that operates as further described below. In various embodiments, the inverter controller and communications module may be implemented in a common system, such as a system based on a microprocessor, microcontroller, or the like. In other embodiments, the inverter controller may be implemented by a separate controller module and communications module that have a means of communication between them. Inverter 114 may be constructed using any suitable circuit topology (e.g., full bridge, half bridge, etc.) and may be implemented using any suitable semiconductor switching device technology (e.g., MOSFETs, IGBTs, etc. made using silicon, silicon carbide, or gallium nitride devices).

Inverter 114 may deliver the generated AC voltage to a transfer coil 112. In addition to a wireless coil allowing magnetic coupling to the receiver, the transfer coil block 112 illustrated in FIG. 1 may include tuning circuitry, such as additional inductors and capacitors, that facilitate operation of the transmitter in different conditions, such as different degrees of magnetic coupling to the receiver, different operating frequencies, etc. The wireless coil itself may be constructed in a variety of different ways. In some embodiments, the wireless coil may be formed as a winding of wire around a suitable bobbin. In other embodiments, the wireless coil may be formed as traces on a printed circuit board. Other arrangements are also possible and may be used in conjunction with the various embodiments described herein. The wireless transfer coil may also include a core of magnetically permeable material (e.g., ferrite) configured to affect the flux pattern of the coil in a way suitable to the particular application. The teachings herein may be applied in conjunction with any of a wide variety of transfer coil arrangements appropriate to a given application. In some contexts, transfer coil 112 may be described as a transmitting or transmitter coil. In some embodiments a device may be capable of bidirectional operation, i.e., transmitting or receiving wireless power, and thus the wireless power transfer coil of such device could be capable of transmitting or receiving power, depending on the operating mode.

PTx controller/communications module 116 may monitor the transfer coil and use information derived therefrom to control the inverter 114 as appropriate for a given situation. For example, controller/communications module may be configured to cause inverter 114 to operate at a given frequency or output voltage depending on the particular application. In some embodiments, the controller/communications module may be configured to receive information from the PRx device and control inverter 114 accordingly. This information may be received via the power transmission coils (i.e., in-band communication) or may be received via a separate communications channel (not shown, i.e., out-of-band communication). For in-band communication, controller/communications module 116 may detect and decode signals imposed on the magnetic link (such as voltage, frequency, or load variations) by the PRx to receive information and may instruct the inverter to modulate the delivered power by manipulating various parameters of the generated voltage (such as voltage, frequency, etc.) to send information to the PRx. In some embodiments, controller/communications module may be configured to employ frequency shift keying (FSK) communications, in which the frequency of the inverter signal is modulated, to communicate data to the PRx. Controller/communications module 116 may be configured to detect amplitude shift keying (ASK) communications or load modulation-based communications from the PRx. In either case, the controller/communications module 126 may be configured to vary the current drawn on the receiver side to manipulate the waveform seen on the Tx coil to deliver information from the PRx to the PTx. For out-of-band communication, additional modules that allow for communication between the PTx and PRx may be provided, for example, WiFi, Bluetooth, or other radio links or any other suitable communications channel.

As mentioned above, controller/communications module 116 may be a single module, for example, provided on a single integrated circuit, or may be constructed from multiple modules/devices provided on different integrated circuits or a combination of integrated and discrete circuits having analog, digital, and/or programmable components, which may be field programmable or updatable. The teachings herein are not limited to any particular arrangement of the controller/communications circuitry.

PTx device 110 may optionally include other systems and components, such as a separate communications module 118. In some embodiments, comms module 118 may communicate with a corresponding module tag in the PRx via the power transfer coils. In other embodiments, comms module 118 may communicate with a corresponding module using a separate physical channel 138.

As noted above, wireless power transfer system also includes a wireless power receiver (PRx) 120. Wireless power receiver can include a transfer coil 122 that may be magnetically coupled 130 to the transfer coil 112. As with transfer coil 112 discussed above, transfer coil block 122 illustrated in FIG. 1 may include tuning circuitry, such as additional inductors and capacitors, that facilitate operation of the transmitter in different conditions, such as different degrees of magnetic coupling to the receiver, different operating frequencies, etc. The wireless coil itself may be constructed in a variety of different ways. In some embodiments, the wireless coil may be formed as a winding of wire around a suitable bobbin. In other embodiments, the wireless coil may be formed as traces on a printed circuit board. Other arrangements are also possible and may be used in conjunction with the various embodiments described herein. The wireless transfer coil may also include a core of magnetically permeable material (e.g., ferrite) configured to affect the flux pattern of the coil in a way suitable to the particular application. The teachings herein may be applied in conjunction with any of a wide variety of transfer coil arrangements appropriate to a given application. In some contexts, transfer coil 122 may be described as a receiving or receiver coil. In some embodiments a device may be capable of bidirectional operation, i.e., transmitting or receiving wireless power, and thus the wireless power transfer coil of such device could be capable of transmitting or receiving power, depending on the operating mode.

Transfer coil 122 outputs an AC voltage induced therein by magnetic induction via transfer coil 112. This output AC voltage may be provided to a rectifier 124 that provides a DC output power to one or more loads associated with the PRx device. Rectifier 124 may be controlled by a controller/communications module 126 that operates as further described below. In various embodiments, the rectifier controller and communications module may be implemented in a common system, such as a system based on a microprocessor, microcontroller, or the like. In other embodiments, the rectifier controller may be implemented by a separate controller module and communications module that have a means of communication between them. Rectifier 124 may be constructed using any suitable circuit topology (e.g., full bridge, half bridge, etc.) and may be implemented using any suitable semiconductor switching device technology (e.g., MOSFETs, IGBTs, etc. made using silicon, silicon carbide, or gallium nitride devices).

PRx controller/communications module 126 may monitor the transfer coil and use information derived therefrom to control the rectifier 124 as appropriate for a given situation. For example, controller/communications module may be configured to cause rectifier 124 to operate provide a given output voltage depending on the particular application. In some embodiments, the controller/communications module may be configured to send information to the PTx device to effectively control the power delivered to the receiver. This information may be received sent via the power transmission coils (i.e., in-band communication) or may be sent via a separate communications channel (not shown, i.e., out-of-band communication). For in-band communication, controller/communications module 126 may, for example, modulate load current or other electrical parameters of the received power to send information to the PTx. In some embodiments, controller/communications module 126 may be configured to detect and decode signals imposed on the magnetic link (such as voltage, frequency, or load variations) by the PTx to receive information from the PTx. In some embodiments, controller/communications module 126 may be configured to receive frequency shift keying (FSK) communications, in which the frequency of the inverter signal has been modulated to communicate data to the PRx. Controller/communications module 126 may be configured to generate amplitude shift keying (ASK) communications or load modulation-based communications from the PRx. In either case, the controller/communications module 126 may be configured to vary the current drawn on the receiver side to manipulate the waveform seen on the Tx coil to deliver information from the PRx to the PTx. For out-of-band communication, additional modules that allow for communication between the PTx and PRx may be provided, for example, WiFi, Bluetooth, or other radio links or any other suitable communications channel.

As mentioned above, controller/communications module 126 may be a single module, for example, provided on a single integrated circuit, or may be constructed from multiple modules/devices provided on different integrated circuits or a combination of integrated and discrete circuits having analog, digital, and/or programmable components, which may be field programmable or updatable. The teachings herein are not limited to any particular arrangement of the controller/communications circuitry. PRx device 120 may optionally include other systems and components, such as a communications ("comms") module 128. In some embodiments, comms module 128 may communicate with a corresponding module in the PTx via the power transfer coils. In other embodiments, comms module 128 may communicate with a corresponding module or tag using a separate physical channel 138.

Numerous variations and enhancements of the above-described wireless power transmission system 100 are possible, and the following teachings are applicable to any of such variations and enhancements.

Improved Friendly Metal Loss Estimation

In some applications, it may be desirable to increase the rate of power transfer from a wireless power transmitter to a wireless power receiver. One approach to achieve this can be the use of a magnetic power profile ("MPP") as described in the Qi 2.0 specification promulgated by the Wireless Power Consortium ("WPC"). MPP can employ magnets to provide for improved alignment between the respective wireless power transfer coils of the wireless power transmitter and wireless power receiver. This improved alignment can be one aspect of facilitating higher levels of power transfer. Another aspect of achieving higher levels of power transfer can include improved techniques for foreign object detection and the losses associated therewith. In some cases, the presence of a foreign object near the wireless power transmitter and/or receiver can absorb power and lead to undesired heating of the foreign object. Mitigating these effects can be based on power loss accounting ("PLA") techniques, in which comparisons between the power transmitted by the wireless power transmitter, the power received by the wireless power receiver can be used to determine power losses associated with the wireless power transfer.

By modeling expected losses for a given wireless power transfer level, the presence of a foreign object may be inferred if the actual losses being experienced exceed the expected losses by some threshold amount. Expected losses can come from a variety of sources, including losses associated with the circuitry of the wireless power transmitter and/or receiver, "friendly metal" in the housings or other structures of the wireless power transmitter and/or receiver, etc. In cases where the actual losses experienced (e.g., measured) exceed the expected level based on modeling, mitigation techniques can be employed, such as reducing or stopping power transfer, providing an audio or visual indication (or other feedback) to a user, etc.

Friendly Metal Loss Estimation Introduction

Exemplary friendly metal loss modeling and estimation techniques are described in Applicant's co-pending U.S. patent application Ser. No. 18/166,839, entitled "Friendly Metal Loss Estimation," filed Feb. 9, 2023, which is incorporated by reference in its entirety, and certain teachings of which are reproduced below.

Wireless power transfer as described above depends on the degree of electromagnetic coupling between the PTx and the PRx. For example, in inductive charging systems, the transfer coil 112 and the transfer coil 122 may be thought of as a loosely coupled transformer. As such, the relative position of the PTx and PRx can affect the degree of magnetic coupling between the PTx and PRx, which, in turn, can affect the power transfer capability of the system. FIG. 2A illustrates a simplified diagram of a PTx (110)-PRx (120) system. Both devices are illustrated in plan view (upper part of the diagram) and an edge-on section view (lower part of the diagram). PTx device 110 includes transfer coil 112, and PRx device 120 includes a transfer coil 122. In some embodiments, PTx device 110 may be a wireless charging pad, mat, or stand (or other wireless power transfer device), and PRx device 120 may be a mobile phone, tablet computer, smart watch, (or other wireless power receiver device). Although the respective devices are depicted as generally rectangular in shape with generally circular charging coils, it is to be appreciated that other configurations are also possible.

FIG. 2B illustrates the PTx 110 and PRx 120 in an "optimal" alignment. In FIG. 2B, the devices—and more specifically, their wireless power transfer coils—are horizontally aligned (as depicted in the plan view), vertically aligned, and as close together as possible (as illustrated in the sectional view). In this context, horizontal and vertical are merely used as terms of convenience, and the true orientation of the system may vary, and the following description is applicable to a system in any such orientation, although "horizontal" and "vertical" will continue to be used for contextual clarity. FIG. 2C illustrates the devices with a slight misalignment. More specifically, there is a radial displacement "r" that can be appreciated by noting that the centers of coils 112 and 122 are no-longer co-incident in the plan view. Such radial displacement may be caused by any number of things, for example, a slight misplacement of a phone with respect to a charging pad. Furthermore, there is also a vertical displacement "z" that can be appreciated by noting the separation between PTx device 110 and PRx device 120 in the sectional view. This vertical displacement may also be caused by any number of things, for example, a phone enclosed in a case or cover. The sectional view also illustrates the lateral/radial displacement. It will be appreciated that in some situation, only a radial displacement or only a vertical displacement may be present.

The offsets described above can reduce the degree of magnetic coupling between the PTx and PRx devices. This reduced magnetic coupling can limit the amount of power that can be delivered from PTx 110 to PRx 120. More specifically, reduced coupling between PTx 110 and PRx 120 reduces the fraction of the power transmitted from PTx 110 that is received by PRx 120. Additionally, a reduced degree of magnetic coupling between PTx 110 and PRx 120 may be at least partially addressed by re-tuning the receiver (or transmitter) circuitry accordingly. For example, one or more tuning capacitors may be included in the PTx circuitry between inverter 114 and transfer coil 112. Likewise, one or more tuning capacitors may be included in the PRx circuitry between rectifier 124 and transfer coil 122. The function of these respective capacitors is tuning the circuit by adjusting the resonant frequency of the respective circuits, and they may include, for example, series resonant capacitors in series with the respective coils or parallel resonant capacitors in parallel with the respective coils, depending on the particular designed operating modes of the circuit. To that end, multiple selectable capacitors may be provided on either or both of PTx 110 and PRx 120, with the appropriate tuning capacitance being selected by the respective device based on estimates of coupling factor derived from various observable circuit parameters, such as voltages, currents, etc.

In wireless power transfer systems, it may be desirable to detect the presence of "foreign objects." For example, things like coins, keys, paperclips, etc. that end up in proximity to the wireless power transfer coils can receive a portion of the power that is transmitted by a PTx 110, which both limits the power available to PRx 120 and may lead to induced eddy currents in the foreign objects. Wireless power transfer systems can employ a variety of foreign object detection ("FOD") techniques. One group of FOD techniques is based on power accounting. The basic principle of power accounting is as follows: the power transmitted by PTx 110, less the power received by PRx 120 is "lost" power. This lost power can be thought of as going into one of three places. Some power may be absorbed by so-called "friendly metal" of PTx 110. Some power may be absorbed by friendly metal of PRx 120. Some power may be absorbed by a foreign object. "Friendly metal" in this context means the metallic or otherwise conductive structures that make up PTx and PRx. These may be frames or case portions, internal circuit elements, magnets, etc. These elements are designated as friendly metal because their presence is known to and accounted for in the design of the wireless power transfer system. Losses that are not associated with the friendly metal may be assumed to be associated with a foreign object.

Figure 3:
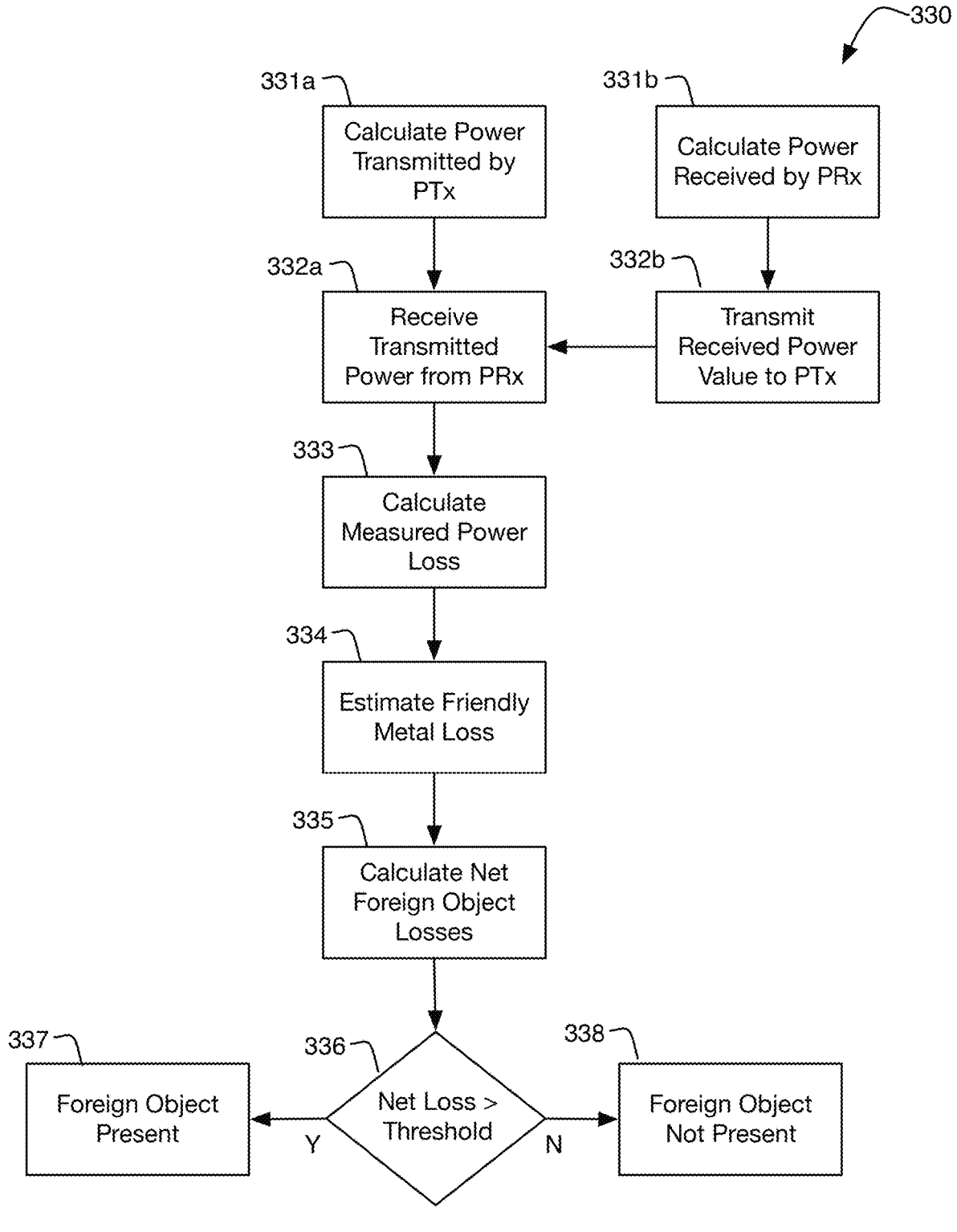
FIG. 3 depicts a simplified flow chart of a foreign object detection technique based on power accounting.

FIG. 3 depicts a simplified flow chart of a foreign object detection technique 330 based on power accounting. Beginning with block 331a, PTx 110 calculates power transmitted by the PTx. This can be achieved by multiplying the output voltage of inverter 114 by the current through transmit coil 112. In some implementations, the power considered to be transmitted by the PTx is the output voltage times the current minus losses in the transmitting coil. Moreover, it is the output-side value(s) that needs to be used. Sometimes, these values, e.g., output RMS current which is AC, may be harder to measure. As an alternative, the input voltage (and/or current) can be used, but then subtracting the inverter and/or coil losses can be done to improve accuracy. Correspondingly, block 331b calculates power received by PRx 120. In some implementations, this is achieved by multiplying the current through transfer coil 122 by the input voltage of rectifier 124. In some applications, it may be difficult to make these measurements on the AC-side of the PRx rectifier. As an alternative, the received power can be calculated as the power out of (rather than in to) the rectifier of PRx 120 plus estimated losses in the rectifier and coil 122. Additionally or alternatively, PTx side power measurements or estimates could be used for power estimation. These PTx side measurements can be based on the DC input power to the PTx 110 or an AC measurement of the output of inverter 114. To summarize, power transmitted by PTx 110 or received by PRx 120 can be estimated either by directly measuring current flowing through the respective wireless power transfer coil (112/122) or indirectly using the DC current into the transmitter or out of the receiver. The respective voltages and currents may be monitored sensors coupled to the respective controller circuitry located in controller and communications modules 116 (for PTx 110) and 126 (for PRx 120). Implementation of such measurement systems is known to those skilled in the art, and thus is not repeated here.

In block 332b, PRx 120 can communicate the received power value to PTx 110, which it receives as illustrated in block 332a. This discussion assumes that the foreign object detection is performed by PTx 110, for example by circuitry located in controller/communications module 126. However, in some applications, the foreign object detection process could run on PRx 120, in which case PTx 110 could transmit its measured power value to PRx 120. In either case, this could take place either by in-band communication (involving modulation of the voltage, current, frequency, phase, etc. wireless power transferred) or out-of-band communication using separate communications modules 118/128 and separate communications channel 138, which could be near field communication (NFC), Bluetooth communication, WiFI communication, etc. as discussed above. Alternatively, rather than transmit calculated power values, the device could transmit the underlying measurements (e.g., voltage and current measurements) that would allow the counterpart device to calculate the respective power.

In either case, in block 333, the PTx (or PRx, if it is performing foreign object detection) can calculate the measured power loss as the difference between transmitted power and received power. As noted above this measured power loss can include two components: friendly metal losses (associated with either PTx 110 or PRx 120) and foreign object losses. Thus, in block 334, the PTx (or PRx, if it is performing foreign object detection) estimates the friendly metal losses. An exemplary friendly metal loss estimation technique is discussed in greater detail below with respect to FIG. 4. For purposes of this discussion, estimation of the friendly metal losses may be thought of as a computation based on observable circuit parameters (voltages, currents, coupling factors, etc.) and predetermined parameters that relate these observable circuit parameters to the resulting losses. These parameters may be part of a model that can be analytically or empirically derived during the design of a particular wireless power transfer device. These model parameters may be stored in a memory associated with a controller of the respective wireless power transfer device and either used by that device to estimate its friendly metal losses or provided to a counterpart device to allow that device to estimate the friendly metal losses of its counterpart.

Once the friendly metal losses have been estimated/determined (block 334), the device performing the foreign object detection can calculate the net foreign object losses (block 335), which can be the difference between the calculated measured power loss (block 333) and the estimated friendly metal losses (block 334). The net foreign object losses can then be compared to a net loss threshold (block 336). If the net foreign object losses are less than the threshold, then it can be inferred that no foreign object is present (block 338) and no mitigation is required. Alternatively, if the net foreign object losses are greater than the threshold (block 336), then it can be inferred that a foreign object is present (block 337) and some mitigation may be employed. Such mitigations can include reducing or limiting the amount of power transferred, interrupting power transfer, providing an alert to the user, such as an audiovisual alert, etc.

In high performance wireless power transfer systems, even relatively small levels of foreign object loss may be significant, and thus it is desirable to be able to detect such losses at a level that may be somewhat below the friendly metal losses. Thus, accuracy in the estimated friendly metal losses is desirable. For example, if the estimated friendly metal is higher than the actual friendly metal losses, then there may be undesirable eddy currents induced in a foreign object. Alternatively, if the estimated friendly metal loss is lower than the actual friendly metal losses, the system may unnecessarily apply mitigations, such as those discussed above. However, these mitigations can present undesirable user experiences, such as slower or completely interrupted charging, spurious user interface messages, etc. Moreover, all of these issues may become even more pronounced as typical wireless power levels increase from relatively lower levels (e.g., 5 W or so) to relatively higher levels (e.g., 20 W or more).

One way to estimate friendly metal losses is as a function of the current flowing through PTx transmit coil 112. The friendly metal losses can be measured as a linear function of the square of the transmit coil current, namely:

$$P_{FM} = \alpha_{FM}(I_{TX})^2 + \beta_{FM}$$

where $P_{FM}$ is the estimated friendly metal losses, $\alpha_{FM}$ is a first coefficient and $\beta_{FM}$ is a second coefficient. As noted above, the coefficients may be derived analytically or empirically, e.g., based on a regression model that is linear in $I_{TX^2}$. However, this model can be further refined in two ways. First, a more accurate estimation of friendly metal losses may be obtained by modeling the losses as a function of voltage, not just current. Second, the friendly metal loss model may be modified to account for differing coupling factors.

With respect to the first refinement, in addition to the transmit coil current $I_{TX}$, the inverter's DC input voltage $V_{in}$ can be included to improve the friendly metal loss model. (As an alternative, the inverter output voltage or any other suitable voltage could also be used. The estimated friendly metal losses can thus be given by:

$$P_{FM} = \alpha_{FM}(I_{TX})^2 + \beta_{FM} + \gamma_{FM}V_{in} + \delta_{FM}$$

where $P_{FM}$ is the estimated friendly metal losses, $\alpha_{FM}$ is a first coefficient related to transmit coil current, $\gamma_{FM}$ is a second coefficient relating to inverter voltage, and $\beta_{FM}$ & $\delta_{FM}$ are DC offset terms (coefficients) that may be combined. As noted above, the coefficients may be derived analytically or empirically, e.g., based on a multiple regression model that is linear in two independent variables $I_{TX^2}$ (the square of the transmit coil current) and $V_{in}$ the inverter input voltage (or other suitable voltage, such as $V_{in^2}$ or $V_{rect}$, if applicable). This refinement can significantly improve the accuracy of friendly metal loss estimation. This is an example of a PTx-side only friendly metal loss estimation.

With respect to the second refinement, different model coefficients may be provided for different coupling conditions. For example, a first set of coupling coefficients may be employed for high coupling conditions, in which the coupling factor k between a PTx 110 and PRx 120 is above a threshold, and a second set of coupling coefficients may be employed for low coupling conditions, in which the coupling factor k between a PTx 110 and PRx 120 is below the threshold. Thus, if both the first and second refinements are employed, the estimated friendly metal losses can be given by:

$$P_{FM} = \alpha_{FM}^{[m]}(I_{TX})^2 + \beta_{FM}^{[m]} + \gamma_{FM}^{[m]}V_{in} + \delta_{FM}^{[m]}$$

$$m = \begin{cases} 0 & k < k_{th} \\ 1 & k \geq k_{th} \end{cases}$$

where $P_{FM}$ is the estimated friendly metal losses, $$\alpha_{FM}^0, \beta_{FM}^0, \gamma_{FM}^0, \text{and } \delta_{FM}^0$$

are the model coefficients for a low coupling condition, $$\alpha_{FM}^1, \beta_{FM}^1, \gamma_{FM}^1, \text{and } \delta_{FM}^1$$

are the model coefficients for a high coupling condition, k is a coupling coefficient, and kth is a threshold coupling coefficient that is the boundary between the low coupling condition and the high coupling condition. In some applications, additional higher order terms (e.g., $V_{in^2}$, $V_{in^3}$, etc.) or lower order terms (e.g., $I_{TX}$) could be included in the model with appropriate coefficients. Despite being defined in terms of low and high coupling condition, some implementations may use more than two coupling conditions, with appropriate coefficients, such as a three-level system with low, mid, and high degrees of coupling and associated coefficients, or higher numbers of coupling conditions with corresponding numbers of coefficients.

Such an arrangement may leverage already existing logic and functionality in the control circuitry of a wireless power transmitter (or receiver). For example, as noted above, some wireless power transfer devices may include controller circuitry that measures certain circuit parameters, (e.g., voltages and currents) and estimates a coupling factor k based on these values. The controller circuitry may then select a tuning capacitor (or capacitors) to provide appropriate tuning for the circuit for such a coupling factor. This same computation can then be used to select the appropriate coefficients for the friendly metal loss estimation model as well.

Figure 4:
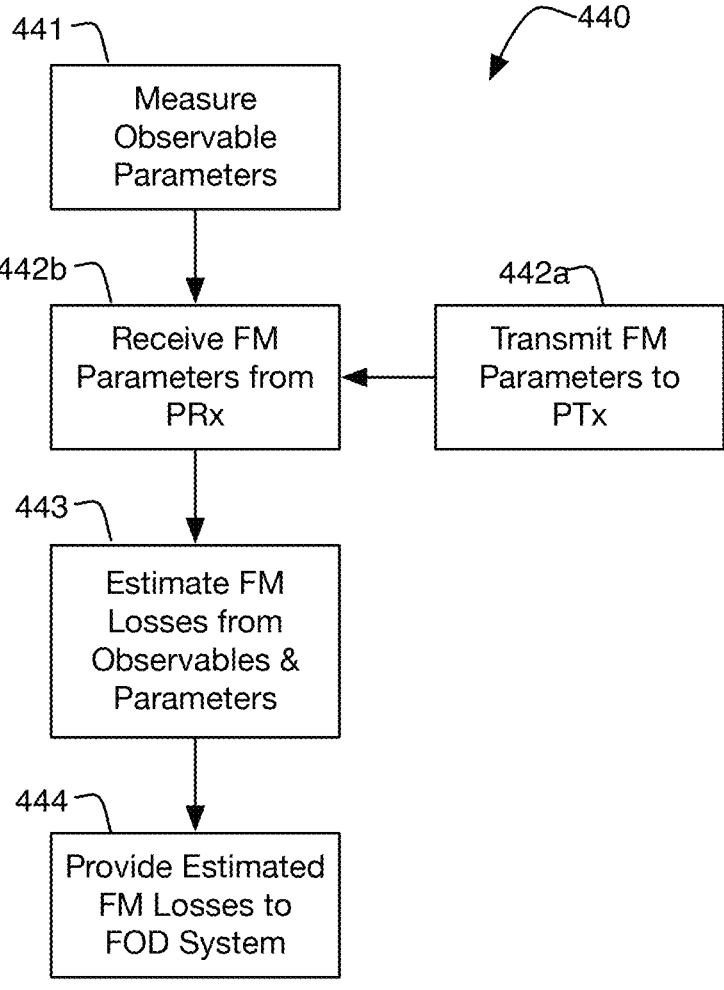
FIG. 4 illustrates a flowchart of a friendly metal loss estimation technique.

FIG. 4 illustrates a flowchart of a friendly metal loss estimation technique 440. Beginning with block 441, the FOD system can measure observable parameters of the wireless power transfer system. These measurements can be performed by PTx 110, if PTx 110 is implementing the FOD system, or by PRx 120, if PRx 120 is implementing the FOD system. These observable parameters can include wireless power transfer voltages, currents, phase shifts, frequencies, impedances, etc., as well as parameters that can be derived therefrom, such as power consumptions, efficiencies, coupling coefficients, etc. The device implementing the FOD system can perform these measurements using appropriate sensors in combination with the control circuitry of the device, as discussed above.

In block 442b, a FOD system implemented by PTx 110 can receive friendly metal parameters from PRx 120 (block 442a). If the FOD system were implemented by PRx 120, then the reverse could be true. This communication can take place using either in-band or out-of-band communications, as discussed above. The transmitted friendly metal parameters can include model coefficients as described above, including model parameters relating to current, voltage, and coupling factor. In one embodiment, the PRx could send a list of parameters including current and voltage parameters for a first coupling coefficient and current and voltage parameters for a second coupling coefficient. In the case of wireless power transfer systems that can operate at different power transfer frequencies, it may be appropriate to include different parameters for different operating frequencies. In some applications, the communication can take place according to a predetermined industry standard, such as the Qi standard for wireless power transfer/charging that is promulgated by the Wireless Power Consortium organization.

In block 443, the FOD system can estimate the friendly metal losses from the observables obtained in block 441 and the received parameters from the counterpart device. The FOD system may also have friendly metal loss modeling parameters associated with itself, which may correspond to the different coupling factors and/or operating frequencies of the received friendly metal loss modeling parameters received from the counterpart device. Then, in block 444, the estimated friendly metal losses can be supplied to the FOD system, such as the one described above with respect to FIG. 3, for foreign object detection.

Described below are improved MPP Power Loss Accounting (MPLA) techniques that can be employed to further improve the accuracy of expected loss estimation. MPLA as defined in the Qi v2.0 specification made assumptions on the modelling of friendly metal losses ($P_{FM}$) in the wireless power system. To improve the accuracy, a new model for friendly metal loss is proposed to account for variations in rectified voltage and current.

Further Friendly Metal Loss Discussion

MPLA power loss estimation begins with estimating power delivered to a foreign object by estimating the difference between the power transmitted by the wireless power transmitter and the power received by a wireless power receiver. In at least some embodiments, this comparison can be performed by controller circuitry located in the wireless power transmitter, although it may be possible in some embodiments for this comparison to be performed by controller circuitry located in the wireless power receiver. In either case, the comparison can be expressed by the following equation:

$$P_{FO} = P_{PT} - P_{PR} \quad (P_{FO}: \text{EQ. 1})$$

where $P_{FO}$ is the power dissipated in a foreign object, $P_{PT}$ is power transmitted by the wireless power transmitter, and $P_{PR}$ is power received by the wireless power receiver. Furthermore, power transmitted by the wireless power transmitter can be expressed as:

$$P_{PT} = V_{IN}I_{IN} - P_{circuit\,loss,TX} - P_{coil\,loss,TX} - P_{FM\,loss} \quad (P_{PT}: \text{EQ. 2})$$

where $V_{IN}$ and $I_{IN}$ are the input voltage and current of the inverter of the wireless power transmitter, $P_{circuit\,loss,\,TX}$ represents circuit losses associated with the wireless power transmitter circuitry, $P_{coil\,loss,\,TX}$ represents losses associated with the wireless power transfer coil of the wireless power transmitter, and $P_{FM\,loss}$ represents losses associated with friendly metal of the wireless power transmitter. As noted above, "friendly metal" is metallic or other conductive structures associated with the wireless power transmitter and receiver devices themselves, such as housing(s), internal structures, etc. Similarly, power received by the wireless power receiver can be expressed as:

$$P_{PR} = V_{RECT}I_{RECT} + P_{circuit\,loss,RX} + P_{coil\,loss,RX}$$

where $V_{RECT}$ and $I_{RECT}$ are the output voltage and current of the rectifier of the wireless power receiver, $P_{circuit\,loss,\,RX}$ represents circuit losses associated with the wireless power receiver circuitry, $P_{coil\,loss,\,RX}$ represents losses associated with the wireless power transfer coil of the wireless power receiver.

In some applications, various improvements to wireless power transfer can be achieved by varying the rectifier voltage VRECT, i.e., the output voltage of the rectifier 124 in the wireless power receiver. (See, e.g., 124; FIG. 1). In such cases, it may be desirable to expand the friendly metal loss term, $P_{FM\,loss}$, to account for variability in the rectified voltage and current ($V_{RECT}$ and $I_{RECT}$). For example, the friendly metal loss can be expressed as:

$$P_{FM\,loss} = g_{FM,ITX}\,\alpha_{FM,ITX}\,I_{TX}^2 + \quad (P_{FM\,loss}: \text{EQ. 4})$$
$$g_{FM,IRECT}\,\alpha_{FM,IRECT}\,I_{RECT}^2 + g_{FM,VRECT}\,\alpha_{FM,VRECT}\,V_{RECT}^2$$

where $g_{FM,ITX}$, $g_{FM,IRECT}$, and $g_{FM,VRECT}$ are ecosystem scaling terms (as described in greater detail below), and $\alpha_{FM,ITX}$, $\alpha_{FM,IRECT}$, and $\alpha_{FM,VRECT}$ are coefficients relating to the electrical and magnetic circuit parameters (physical and/or equivalent) that characterize the wireless power transfer system. Such coefficients can be described in a variety of ways, some of which are described in greater detail herein. Stated more generally, the friendly metal losses can be modelled in the form:

$$P_{FM} = a \cdot I_{TX}^2 + b \cdot I_{RECT}^2 + c \cdot V_{RECT}^2 \quad (P_{FM}: \text{EQ. 5})$$

where $P_{FM}$ are the estimated friendly metal losses, $I_{TX}$ is the DC current into the inverter of the wireless power transmitter, $I_{RECT}$ is the DC current out of the rectifier of the wireless power receiver, and $V_{RECT}$ is the DC output voltage of the rectifier of the wireless power receiver, with a, b, and c being fit coefficients that characterize the particular wireless power transfer system. The above-described model does not require a DC bias term as in some prior power loss accounting techniques.

Figure 5A:
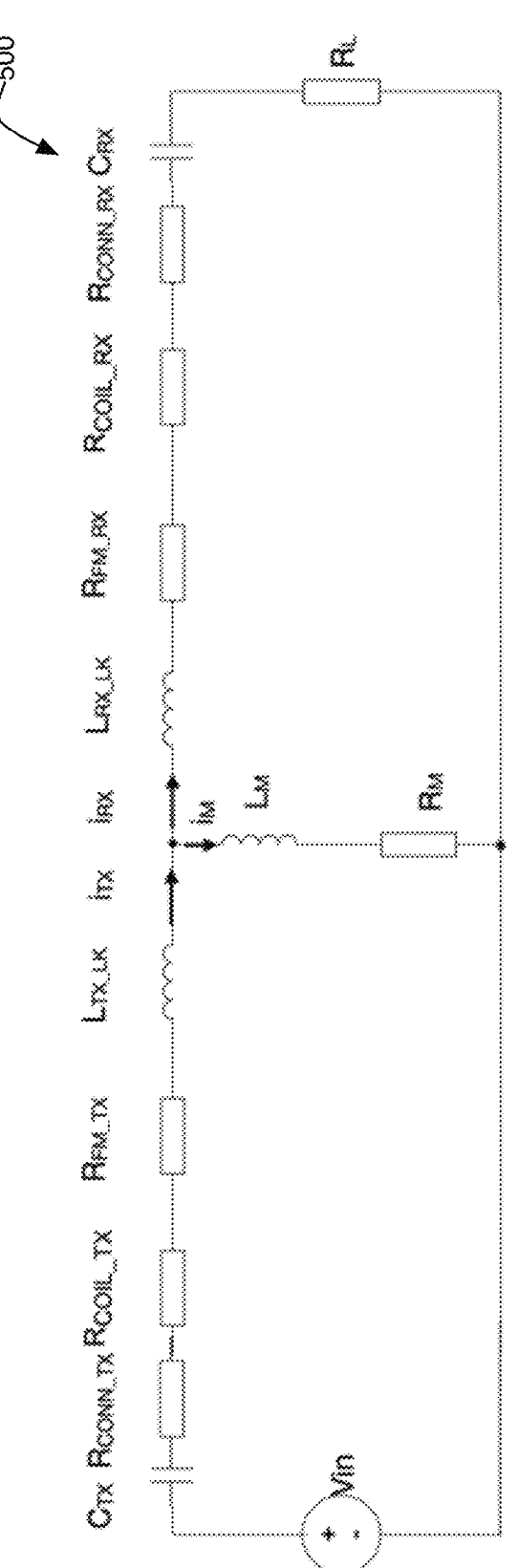
FIGS. 5A-5B illustrate a circuit model and associated equations of a wireless power transfer system.
Figures 5B, 6:
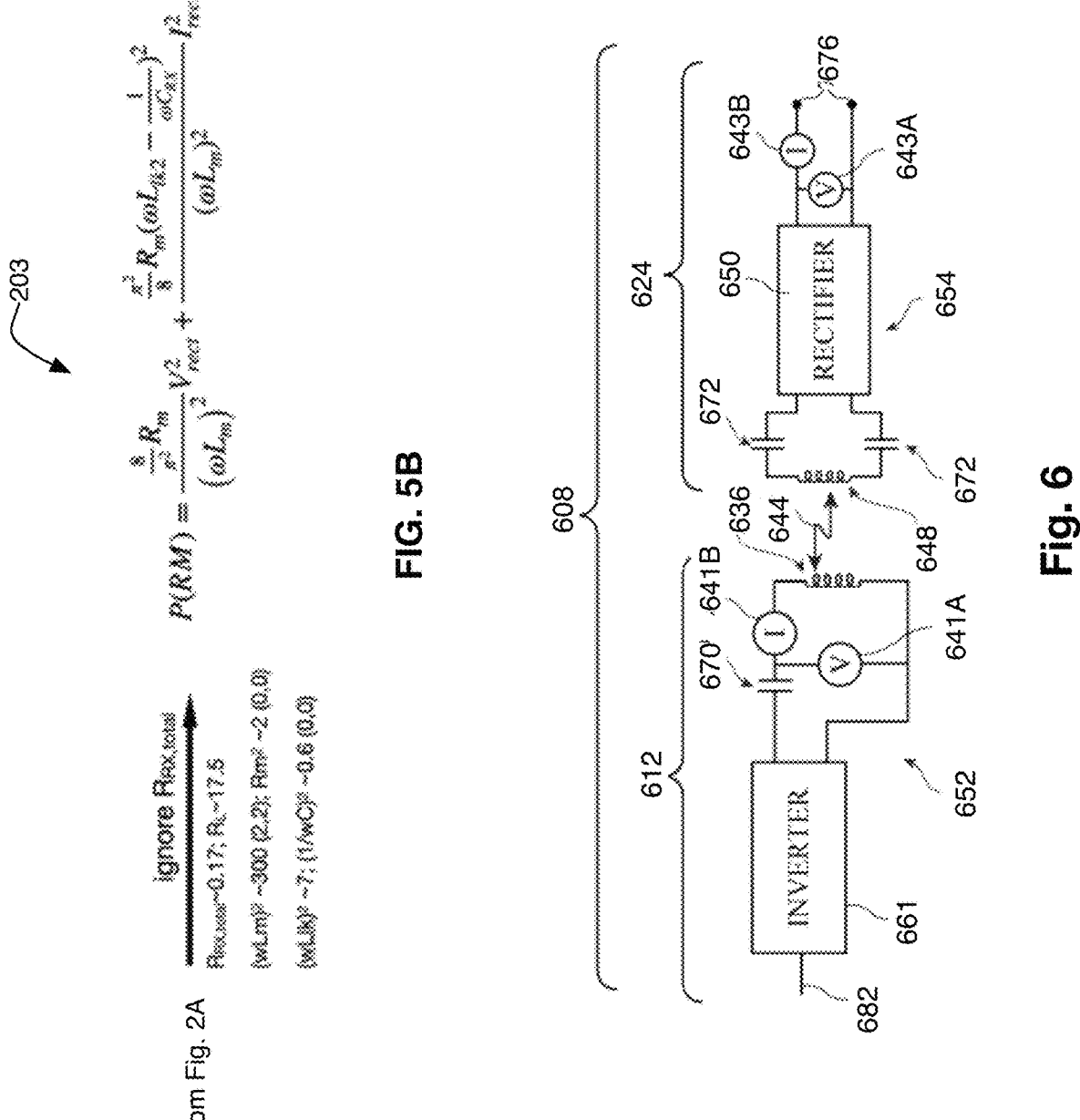
FIG. 6 is a circuit diagram of an illustrative wireless power system in accordance with an embodiment.

FIGS. 5A and 5B illustrate a derivation of the above-described model. More specifically, FIG. 5A depicts an equivalent circuit 500 that can be used to model the wireless power transfer system. In equivalent circuit 500, the inverter input voltage is represented by voltage source Vin, and the load on the wireless power receiver is represented by resistance $R_L$. The wireless power transmitter current $i_{TX}$ flows through: capacitance $C_{TX}$, representing the tuning capacitance of the wireless power transmitter; resistance $R_{CONN\_TX}$, representing conduction losses associated with the wireless power transmitter circuitry; resistance $R_{COIL\_TX}$, representing losses in the wireless power transfer coil of the wireless power transmitter; resistance $R_{FM\_TX}$, representing friendly metal losses associated with metallic or other conductive structures in the wireless power transmitter; and inductance $L_{TX\_LK}$, representing leakage inductance of the wireless power transfer coil of the wireless power transmitter. Wireless power transmitter current $i_{TX}$ can then be modelled as splitting into magnetizing current $i_M$ and receiver current $i_{RX}$. Magnetizing current $i_M$ flows through inductance $L_M$ and resistance $R_M$ representing the magnetization effects of the wireless power transfer coils. Receiver current $i_{RX}$ flows through inductance $L_{RX\_LK}$, representing leakage inductance of the wireless power transfer coil of the wireless power receiver; $R_{FM\_RX}$, representing friendly metal losses associated with metallic or other conductive structures in the wireless power receiver; $R_{COIL\_RX}$, representing losses in the wireless power transfer coil of the wireless power receiver; resistance $R_{CONN\_RX}$, representing conduction losses associated with the wireless power receiver circuitry; and capacitance $C_{RX}$, representing the tuning capacitance of the wireless power receiver. Rather than particular physical devices, the above-described circuit elements may be representative such devices and/or may be lumped parameters representing or modelling multiple physical components or structures.

With further reference to FIG. 5A, equations 501 describe interrelationships between the various circuit elements and parameters of the equivalent circuit model 500. These equations may be combined to produce equations 502. Then, with further reference to FIG. 5B, the equations may be further manipulated to produce equation 503, which expresses the losses in terms of $$V_{RECT}^2 \text{ and } I_{RECT}^2,$$

which is similar to the form of equations 4 and 5, above.

While the above description models friendly metal losses in terms of transmitter current squared $$(I_{TX}^2),$$

receiver rectifier voltage squared $$(V_{RECT}^2),$$

and receiver rectifier current squared $$(I_{RECT}^2),$$

such losses may be modelled in other ways based on other orders of such variables, such as transmitter current ($I_{TX}$), rectifier voltage ($V_{RECT}$), and rectifier current ($I_{RECT}$) and/or may be modelled in conjunction with other voltages, currents, or other circuit parameters.

Further aspects of power loss accounting, including losses attributable to friendly metals, in terms of rectifier voltage $V_{RECT}$ and rectifier current $I_{RECT}$ are described in Applicant's co-pending U.S. patent application Ser. No. 18/617,103, entitled "Power Transfer Accounting for Wireless Power Transfer," filed Mar. 26, 2024, which is incorporated by reference in its entirety.

Ecosystem Scaling

The accuracy of friendly metal loss estimation may vary depending on different possible wireless power transmitter and wireless power receiver pairings. In some implementations, baseline values and/or adjustments (e.g., such as scaling coefficients, offsets, so forth) can be determined for various pairs of wireless power transmitters and iwreless power receivers, e.g., at manufacture, and stored in one or more of the wireless power transmitter and receiver devices. However, as the number of potential transmitter-receiver pairs becomes larger, this may quickly become impracticable. Thus, it may be desired to provide for each transmitter one or more baseline value pairs based on one or more "reference" or "golden" receiver pairings. Then, each receiver can be characterized relative to one or more of the reference/golden receivers and can be provided with its own stored values corresponding to such characterization. For example, this could be implemented as a variety of scaling factors relative to the reference/golden receiver(s). Then, a wireless power receiver could provide its scale factors to the wireless power transmitter, which could then adjust its friendly metal estimations based on the stored reference values and the scaling factors, which account for differences in the magnetic parameters of specific wireless power transfer devices, such as inductance (L) of the wireless power transfer coils, quality factor (Q) of the coils, so forth.

Exemplary techniques for loss measurement scaling are described in Applicant's U.S. patent application Ser. No. 17/681,363, entitled "Wireless Power Systems with Shared Inducive Loss Scaling Factors," filed Feb. 25, 2022, which is incorporated by reference herein in its entirety, and certain teachings of which are reproduced below.

To estimate power loss values accurately, various potential sources of power loss in a wireless power system should be taken into account. Some power losses exhibited by power transmitters and receivers are independent of the magnetic properties of the transmitters and receivers (e.g., switching losses, losses that depend on the drain-source resistance of field-effect transistors in the inverters and rectifiers, etc.). Losses such as these can be taken into account by characterizing relevant device components (e.g., by ascertaining transistor drain-source resistances using measurements made during manufacturing tests and/or other tests).

Transmitters and receivers also exhibit power losses that depend on the inductive properties of the transmitters and receivers (e.g., losses dependent on the magnetic properties of coupled transmitters and receivers, sometimes referred to as mating-dependent losses, inductive losses, magnetic losses, etc.). Examples of power losses that are dependent on the magnetic properties of the transmitters and receivers include: 1) coil losses that depend on the alternating-current (AC) resistances of mated transfer coils, 2) friendly metal losses (e.g., power losses due to eddy currents induced in the metal housing of a receiving device, and 3) foreign object losses that arise in the event that a foreign object is present between a transmitter and receiver. Power losses such as these that are dependent on the magnetic properties of the transmitter and receiver may sometimes be characterized in terms of LQK magnetic parameters, where L refers to the inductance of the transfer coils, Q refers to the quality factor of the coils, and K refers to the magnetic coupling of the coils.

In a wireless power ecosystem with numerous different transmitters and receivers, each pairing between a given one of the transmitters and a given one of the receives will result in potentially different set of magnetic properties, thereby posing challenges to accurate assessment of power losses that depend on the magnetic properties of a coupled transmitter-receiver pair. To facilitate accurate transmitter and receiver power loss estimates, the magnetic power loss parameters associated with transmitters and receivers can be determined using measurements between various models of transmitter and receiver and reference units (e.g., reference transmitters and reference receivers). Characterizing information from measurements made with reference transmitters and/or reference receivers can be stored in each different model of device and subsequently used to help ensure accurate power loss estimates are made when a particular model of transmitter is paired with a particular model of receiver.

FIG. 6 shows illustrative wireless power circuitry in a wireless power transfer system 608 in an illustrative scenario in which a wireless power transmitting device has been paired with a wireless power receiving device. In some examples system 608 implements the design of wireless power transfer system 100, which was discussed above with reference to FIG. 1. The wireless power circuitry of FIG. 6 includes wireless power transmitting circuitry 652 in wireless power transmitting device 612 and wireless power receiving circuitry 654 in wireless power receiving device 624. During operation, wireless power signals 644 are transmitted by wireless power transmitting circuitry 652 and are received by wireless power receiving circuitry 654. The configuration of FIG. 6 includes a single transfer coil 636 and a single transfer coil 648 (as an example). In other implementations, voltage across capacitor 670 is measured and current through the coil is inferred from that measurement.

As shown in FIG. 6, wireless power transmitting circuitry 652 includes inverter circuitry 661. Inverter circuitry (inverter) 661 may be used to provide signals to coil 636. During wireless power transmission, the control circuitry of device 612 supplies signals to control input 682 of inverter 661 that cause inverter 661 to supply alternating-current drive signals to coil 636. Circuit components such as capacitor 670 may be coupled in series with coil 636 as shown in FIG. 6. Measurement circuitry 641 in device 612 may make measurements on operating currents and voltages in device 612. For example, voltage sensor 641A may be used to measure the coil voltage across coil 636 and current sensor 641B may be used to measure the coil current through coil 636.

When alternating-current current signals are supplied to coil 636, corresponding alternating-current electromagnetic signals (wireless power signals 644) are transmitted to nearby coils such as illustrative coil 648 in wireless power receiving circuitry 654. This induces a corresponding alternating-current (AC) current signal in coil 648. Capacitors such as capacitors 672 may be coupled in series with coil 648. Rectifier 650 receives the AC current from coil 648 and produces corresponding direct-current power (e.g., direct-current voltage Vrect) at output terminals 676. This power may be used to power a load. Measurement circuitry 643 in device 624 may make measurements on operating currents and voltages in device 624. For example, voltage sensor 643A may measure Vrect (the output voltage of rectifier 650) or a voltage sensor may measure the coil voltage on coil 648. Current sensor 643B may measure the rectifier output current of rectifier 650 or a current sensor may measure the current of coil 648.

The measurements made by measurement circuitry 641 and 643 may be processed to extract magnetic loss properties (e.g., coefficients or other parameters that characterize the amount of power losses in devices 612 and 624 and that are dependent on the magnetic properties of the transmitter and receiver). These measurements may be stored within each device and may be exchanged between devices so that device 612 (and, if desired, device 624) may use this information in accurately estimating the operating conditions of a wireless power transfer system. power losses.

For example, these measurements may be used to estimate how well transmitter and receiver are able to transfer wireless power and therefore whether a user is to be informed that wireless power transfer operations are proceeding normally. As another example, these measurements may be used to estimate a magnetic coupling coefficient k, wireless power transfer efficiency, estimated power loss, and/or other attributes of the mated transmitter-receiver pair. In addition to or instead of estimating power loss to determine whether a foreign object is present and therefore whether to proceed with wireless power transfer, the system 608 may use this information (e.g., estimated foreign object power loss and/or related coupling and/or efficiency information) to determine whether to present the user of system 608 with a confirmatory message to inform a user that wireless power transmission are proceeding properly (e.g., to inform the user that this process has not been thwarted by the presence of poor coupling due to presence of a foreign object, possible misalignment, or other factors). Exemplary confirmatory messages include audio output such as a chime and/or visual output presented on device 624 to reassure a user that charging operations are proceeding normally.

Consider an example in which, following measurements with circuitry 641 and 643, the amount of power potentially absorbed by a foreign object in system 10 is determined using the following equation:

$$PFO = PIN - POUT - PLOSSTX - PLOSSRX \qquad \text{(PFO: EQ. 6)}$$

In equation 6, PFO represents the amount of power absorbed by a foreign object that is present (if any). POUT represents output power (e.g., the output power of rectifier 650), PIN represents input power (e.g., the input power to coil 636), PLOSSTX represents power loss attributable to PTx wireless power transmitter 612, and PLOSSRX represents power loss attributable to wireless power receiver 624. The values of POUT and PIN may be measured (e.g., using circuitry 641 and 643). As discussed above with reference to equations 2 and 3, power losses that are attributable to devices 612 and/or 624 may include losses to friendly metals.

Mathematical models may be used to produce relational expressions for PLOSSTX and PLOSSRX and these expressions can be evaluated using measured operating parameter such as the measurements made using circuitry 641 and 643. For example, with one illustrative modeling embodiment, PLOSSTX and PLOSSRX can be computed using equations 7a and 8a, respectively.

$$PLOSSTX = b * RAIRTX * (ITX)^2 \qquad \text{(PLOSSTX: EQ. 7a)}$$

$$PLOSSRX = \qquad \text{(PLOSSRX: EQ. 8a)}$$
$$m * RAIRRX * (IRX)^2 + \alpha * (IRX)^2 + \alpha DC$$

In equations 7a and 8a, ITX represents transmitter current (e.g., coil current) and IRX represents receiver current (e.g., rectifier output current or, in some embodiments, transfer coil current). The values of RAIRTX and RAIRRX represent measured AC coil resistances for coils 636 and 648 respectively. The values of b, m, $\alpha$, and $\alpha DC$ are model parameters (sometimes referred to as magnetic power loss coefficients) that characterize the performance of the coupled transmitter and receiver pair in system 608. In this example, transmitter power loss PLOSSTX is due to transfer coil power loss in the model of equation 7a, and receiver power loss PLOSSRX has a first component that is due to transfer coil power losses (the first term of equation 8a) and has a second component (made up of the last two terms in equation 8a) that represents friendly metal losses (e.g., losses due to eddy currents induced in the receiver when power is being transferred). Parameter b may sometimes be referred to as transmitter transfer coil loss parameter or coefficient. Parameter m may sometimes be referred to as a receiver transfer coil loss parameter or coefficient, and parameters $\alpha$ and $\alpha DC$ may sometimes be referred to as friendly metal loss parameters or friendly metal loss coefficients. Parameters b, m, $\alpha$, and $\alpha DC$ depend on the magnetic interactions between device 612 and 624 when coupled and may therefore sometimes be referred to as magnetic loss parameters or magnetic loss coefficients.

In an ecosystem in which there are multiple different models of wireless power transmitting device available to a user (e.g., different models of device 612) and multiple different models of wireless power receiving device available to the user (e.g., different models of device 624), the magnetic loss parameters will vary as a function of which particular transmitter and receiver are paired together. If, as an example, a model I transmitter and model J receiver are paired, the amount of power loss in each device will differ from that experienced when these devices are paired with different devices. To account for these variations equations 7a and 8a may be replaced by equations 7b and 8b, respectively.

$$PLOSSTX = gb * bR * RAIRTX * (ITX)^2 \qquad \text{(PLOSSTX: EQ. 7b)}$$

$$PLOSSRX = gm * mR * RAIRRX * (IRX)^2 + \qquad \text{(PLOSSRX: EQ. 8b)}$$
$$g\alpha * \alpha R * (IRX)^2 + g\alpha DC * \alpha RDC$$

In equation 7b, the transmitter transfer coil loss parameter b is replaced by a reference transmitter transfer coil loss value bR (sometimes referred to as a transmitter transfer coil loss coefficient) that is associated with the transmitter loss measured when a reference transmitter is coupled to a reference receiver and this value is then scaled using the scaling factor gb. In equation 8b, the receiver transfer coil loss parameter m is replaced with mR (sometimes referred to as a receiver transfer coil loss coefficient), which is associated with the receiver transfer coil loss measured when a reference receiver and transmitter are coupled, and this value is then scaled using the scaling factor gm. In equation 8b, the friendly metal loss parameters $\alpha$ and $\alpha DC$ are replaced respectively with reference friendly metal loss parameters (coefficients) $\alpha R$ and $\alpha RDC$ extracted using measurements made with a reference transmitter and reference receiver. The reference friendly metal loss parameters are scaled by respective scaling factors $g\alpha$ and $g\alpha DC$. By using scaling factors in computing PLOSSTX (see, e.g., equation 7b) and PLOSSRX (see, e.g., equation 8b), equation 6 can be satisfactorily evaluated across various permutations of pairings of wireless power transmitter and receiver models.

Illustrative operations involved in using measuring wireless power transmitters and receivers to determine their scaling parameters are shown in the flow chart of FIG. 7. Operations in FIG. 7 are performed at design time and the resulting scaling factors are stored in production units. Illustrative operations involved in using the scaling parameters in system 608 are shown in FIG. 8. Operations in FIG. 8 are performed at runtime (e.g., when transmitter and receiver are paired in preparation for transmitting wireless power between transmitter and receiver). In the examples of FIGS. 7 and 8, it is assumed that the scaling factors for a particular model of transmitter (a model I transmitter) and a particular model of receiver (e.g., a model J receiver) are being obtained using reference device measurements and then subsequently used when a model I transmitter is paired with a model J receiver. In general, this process is expected to be performed for numerous models of transmitter (models other than model I) and for numerous models of receiver (models other than model J). Moreover, any of the various different models of transmitter that have been characterized may, in general, be paired by a user with any of the various different models of receiver that have been characterized. This is because not all users own the same model of transmitter, and not all users own the same model of receiver. In the present example, an illustrative user pairs a model I transmitter with a model J receiver during the operations of FIG. 8.

Operations involved in measuring magnetic power loss parameter scaling factors for a model I transmitter and model J receiver are shown in FIG. 7. During the operations of block 790, a reference wireless power receiving device is paired (physically or via a simulated pairing such as a finite element analysis simulation pairing) with a reference wireless power transmitting device. Physical reference devices may be obtained from a centralized source or may be constructed by different device manufacturers in accordance with a universally distributed reference design. Once paired, the reference transmitter and reference receiver may begin transferring power. In particular, during the operations of block 790 the reference transmitter may send wireless power signals to the reference receiver while internal operating parameters (e.g., transmitter and receiver currents and voltages) are measured and stored. From these measurements, the reference magnetic loss parameters are extracted (e.g., the values of reference magnetic loss parameters bR, mR, $\alpha R$, and $\alpha RDC$ are obtained). In scenarios in which pairing simulations are used in place of measurements on physically paired devices, finite element analysis simulation is used to determine the LQK of the coupled transmitter-receiver pair and then circuit simulations are used to determine the expected currents and voltages. These simulated currents and voltages can then be used to determine the magnetic loss parameters.

After the reference magnetic loss parameters have been determined (either by physical measurements or simulations), a model J receiver is paired with a reference transmitter. While these devices are paired in a simulation or while these devices are physically paired and wireless power is being transferred from the reference transmitter to the model J receiver, loss parameter measurements for the model J receiver may be obtained. In particular, during the operations of block 792, the model J loss parameters (coefficients) bRj, mRj, αRj, and αRjDC are obtained. The "J" in each of these parameters and the R (for "reference") in each of these parameters indicates that the loss parameters are specific to a scenario in which a model J receiver is operating with a reference transmitter. The scaling factor gb (equation 7b) for the model J receiver can then be computed using equation 9 and stored in model J wireless power receiving devices (e.g., during manufacturing or later using an update).

$$gb = bRj/bR \qquad \text{(gb: EQ. 9)}$$

During the operations of block 794, a model I transmitter is paired with a reference receiver. Power is transmitted wirelessly while transmitter operating parameters (e.g., currents and voltages) are measured. From these measurements or simulations, magnetic loss parameters miR, biR, αiR, and αiRDC are obtained for the model I transmitter. Using equations 10, 11, and 12, the scaling factors gm, gα, and gαDC for the model I transmitter are then calculated.

$$gm = miR/mR \qquad \text{(gm: EQ. 10)}$$

$$gα = αiR/αR \qquad \text{(gα: EQ. 11)}$$

$$gαDC = αiRDC/αRDC \qquad \text{(gαDC: EQ. 12)}$$

The scaling factors for the model I transmitter are then stored in model I transmitters (e.g., during manufacturing or later using an update).

Illustrative operations involved in using the scaling factors for a model I transmitter and a model J receiver in a scenario in which a model I transmitter and model J receiver are paired by a user are shown in the flow chart of FIG. 8. During the operations of FIG. 8, a user with a model J receiver and a model I transmitter who wishes to wirelessly transfer power from the model I transmitter to the model J pairs the model I transmitter and model J receiver during the operations of block 800 (e.g., by magnetically attaching a model I charging puck to a model J cellular telephone, as just one example).

During the operations of block 802, the model I transmitter and model J receiver exchange information such as their scaling factors (e.g., using low-power in-band communications or other wireless communications) and being to transfer power. For example, the model J receiver sends the value of scaling factor gm that was obtained from the model J measurements with the reference transmitter at block 792 of FIG. 7 to the model I transmitter. The model I transmitter sends the values of scaling factors gm, gα, and gαDC that were obtained from the model I measurements with the reference receiver at block 794 of FIG. 7 to the model J receiver.

While wirelessly transferring power from the model I transmitter to the model J receiver, measurement circuitry 641 in the transmitter and measurement circuitry 643 in the receiver may measure the operating parameters of the transmitter and receiver (e.g., coil currents and voltages, rectifier output voltage and current, etc.). Current and voltage measurements may, if desired, be exchanged between transmitter and receiver (e.g., using in-band wireless communications). The information that is measured with circuitry 641 and 643 may be used in conjunction with the exchanged scaling factors to compute PLOSSRX and PLOSSTX using equations 7b and 8b.

During the operations of block 804, for example, the model J receiver may measure rectifier current and rectifier voltage (the product of which is POUT) and may use the measurements in conjunction with the scaling factors gm, gα, and gαDC that were received from the model I transmitter during the operations of block 802 to evaluate equation 8b and thereby estimate PLOSSRX. The scaling factors received from the model I transmitter provide information to receiver J on the expected operating characteristics of the model I transmitter with respect to receiver transfer coil loss and friendly metal loss.

As an example, consider receiver transfer coil loss. If receiver J were to be paired with a reference transmitter, the value of scaling factor gm would be 1.0. The receiver could then use the first term in equation 8b to determine the receiver transfer coil loss (the receiver transfer coil loss being 1.0*mR*RAIRRX*(IRX)2), where the values of mR, RAIRRX, and receiver current IRX are known to the receiver. In the present situation, however, receiver J is not paired with a reference transmitter, but is instead paired with transmitter I. Transmitter I might previously have been determined to induce lower coil losses in mated receivers than the reference transmitter so the value of gm that transmitter I passed to the model J receiver during block 802 may be 0.9 (as an example). When the model J receiver evaluates equation 8b using the received scaling factor value of 0.9 from the model I transmitter, the model J receiver will accurately estimate a somewhat reduced value of PLOSSRX (due to the presence of the model I transmitter, which is known to induce lower amounts of receiver transfer coil loss than reference transmitters). As this example demonstrates, by using scaling factors received from the model I transmitter, the magnetic loss parameters that the receiver uses to compute PLOSSRX can be scaled appropriately to reflect that a model I transmitter is present instead of a reference transmitter, thereby enhancing the accuracy with which the value of PLOSSRX is estimated.

During the operations of block 806, the model I transmitter uses measurements of measured transmitter transfer coil current ITX, the known values of bR and RAIRTX, and the scaling factor gb received from the receiver in evaluating equation 7b to estimate PLOSSTX. The scaling factor gb is a reflection of how receivers of model J are expected to affect transmitter transfer coil loss in transmitters that are paired with model J receivers instead of reference receivers. As an example, model J receivers may tend to cause paired transmitters to exhibit more transmitter transfer coil loss than reference receivers. As a result, the value of scaling factor gb that the model I transmitter receives from the model J receiver may be 1.1 (as an example). When evaluating equation 7b, this elevated scaling factor will help the transmitter I account for the fact that the model I transmitter is coupled to a model J receiver and should therefore expect larger transmitter transfer coils losses than if coupled to a reference receiver.

During the operations of block 807, the value of PLOSSRX that is computed at block 804 may be sent to the paired transmitter. During the operations of block 808, system 608 evaluates the value of PFO using equation 6 (e.g., an estimate is made of foreign object power loss, if any). By accurately estimating PLOSSTX using the scaling factor information received from the model J receiver and by receiving the estimated value of PLOSSRX from the model J receiver, the model I transmitter will have both PLOSSTX and PLOSSRX for equation 6. The value of PIN may be obtained by the transmitter by computing the product of the transmitter transfer coil current (ITX) and voltage from measurement circuitry 641. The value of POUT may be obtained by the transmitter by computing the product of the rectifier output current IRX and rectifier output voltage received from measurement circuitry 643 or receiving POUT from the receiver.

After determining the value of PFO during the operations of block 808, the transmitter may compare PFO to a threshold power loss value (TH) (block 810). Suitable action may then be taken by system 608. For example, in response to determining that PFO is less than TH, it can be concluded that no foreign object is present and power transfer operations may be allowed to proceed normally (e.g., so that power can be transferred to charge battery 658). In response to determining that PFO is greater than TH, power transfer operations may be restricted. Examples of power transfer restrictions that may be implemented include forgoing all power transfer operations and/or halting power transfer if already in progress, limiting the maximum amount of power that may be transferred (e.g., to a predetermined relatively low power level below the normal maximum power transfer capabilities of system 608), and/or issuing a visual, audible, and/or vibrational alert to a user. If desired alerts for a user (e.g., warnings and/or other informational content informing the user that power transfer operations are not proceeding normally because a foreign object has been detected) may be presented using output devices in device 612 and/or in device 624. For example, control circuitry in device 612 may wirelessly communicate with control circuitry in device 624 to issue a visual alert that is presented on a display in device 624.

Further Ecosystem Scaling Discussion

In an ecosystem in which there are multiple different models of wireless power transmitting devices available to a user and multiple different models of wireless power receiving devices (e.g., different models of either device), the electrical and/or magnetic loss parameters can vary as a function of which particular wireless power transmitter and wireless power receiver are paired together. If, as an example, a model I transmitter and model J receiver are paired, the amount of power loss in each device will differ from that experienced when these devices are paired with different devices.

To account for these variations and thereby ensure accurate estimation of friendly metal, foreign object, and/or other losses, electrical and magnetic power loss parameter scaling factors (sometimes referred to as power loss coefficient scaling factors) can be used. By using such scaling factors in computing various parameters, the loss equations can be satisfactorily evaluated regardless of which models of transmitter and receiver are paired with each other. Exchange of such scaling parameters between various wireless power transfer devices may be thought of as providing for "ecosystem scaling" in that it expands the "ecosystem" of devices that can cooperate to provide wireless power transfer and foreign object detection. Such ecosystem scaling can be extended to the context friendly metal loss estimation described above.

Techniques to perform ecosystem scaling for friendly metal loss estimation can include various aspects depicted in FIG. 9. Beginning with diagram 901 of FIG. 9, on the wireless power transmitter (PTx) side, various gain factors g may be computed for various parameters based on pairings between a "golden" or "reference" wireless power transmitter GTx and wireless power receiver GRx and the actual wireless power transmitter PTx and wireless power receiver PRx. More specifically, scaling or proportionality factors (a) can be used to scale a measurement GG as between the golden or reference transmitter GTx and golden or reference receiver GRx so as to correspond to a measurement GR as between the golden transmitter GTx and the actual receiver PRx. Similarly, scaling or proportionality factors (b) can be used to scale a measurement TR as between the actual wireless power transmitter PTx and actual wireless power receiver PRx to be as between the actual power transmitter PTx and the golden wireless power receiver GRx. Thus, as depicted in the equation below diagram 901, a gain relating to the wireless power transmitter transfer coil $g_{coil,\ TX}$ can be computed to a value that can be stored on the wireless power transmitter.

As illustrated in diagram 902 of FIG. 9, wireless power receiver scaling can proceed similarly. More specifically, various gain factors g may be computed for various parameters based on pairings between a "golden" or "reference" wireless power transmitter GTx and wireless power receiver GRx and the actual wireless power transmitter PTx and wireless power receiver PRx. More specifically, scaling or proportionality factors (a) can be used to scale a measurement GG as between the golden or reference transmitter GTx and golden or reference receiver GRx so as to correspond to a measurement TG as between the golden receiver GRx and the actual transmitter PTx. Similarly, scaling or proportionality factors (b) can be used to scale a measurement TR as between the actual wireless power transmitter PTx and actual wireless power receiver PRx to be as between the actual power receiver PRx and the golden wireless power transmitter GTx. Thus, as depicted in the equation below diagram 902, a gain relating to the wireless power receiver transfer coil $g_{coil,RX}$ can be computed to a value that can be provided to the wireless power receiver and/or can be stored on the wireless power transmitter. Similarly gain parameters for ecosystem scaling can similarly be computed for the coefficients described above relating to friendly metal loss estimation based on transmitter current ($g_{FM,ITX}$), rectifier current ($g_{FM,IRECT}$), and rectifier voltage ($g_{FM,VRECT}$). These gain parameters for ecosystem scaling can be computed by and remain on the wireless power transmitter, although in some embodiments they may also be computed by and/or provided to the wireless power receiver.

Figure 10:
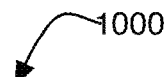
FIG. 10 illustrates some combinations of monitorable parameters in a wireless power transfer system that can be used for friendly metal loss estimation.

FIG. 10 illustrates a table 1000 depicting some combinations of monitorable parameters in a wireless power transfer system that can be used for friendly metal loss estimation. The parameters that can be used can include a DC modeling parameter (DC), transmitter current (squared) $ITX^2$, rectifier current (squared) $IRECT^2$, inverter input voltage (Vin), and rectifier voltage (squared) $VRECT^2$. The description above focused on the combination depicted in row 1041 of table 1000, using transmitter current squared, rectifier current squared, and rectifier voltage squared. However, inventors have experimented with models incorporating two to four of the variables in various combinations as depicted in rows 1042-1051 and have observed differing degrees of accuracy for various models depending on the particular implementation. Thus, for a given implementation, it may be desirable to employ one or more models incorporating different combinations of such variables as appropriate to a given application. In any case, model equations can be selected, and corresponding coefficients can be fit based on power transfer measurements as described above and in the incorporated applications.

Described above are various features and embodiments relating to improving friendly metal loss estimation to improve wireless power transfer in wireless power transfer systems. Such arrangements may be used in a variety of applications but may be particularly advantageous when used in conjunction with electronic devices such as mobile phones, tablet computers, laptop or notebook computers, and accessories, such as wireless headphones, styluses, etc. Additionally, although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The foregoing describes exemplary embodiments of wireless power transfer systems that are able to transmit certain information between the PTx and PRx in the system. The present disclosure contemplates this passage of information improves the devices' ability to provide wireless power signals to each other in an efficient manner to facilitate battery charging, such as by sharing of the devices' ecosystem scaling parameters with one another. Entities implementing the present technology should take care to ensure that, to the extent any sensitive information is used in particular implementations, that well-established privacy policies and/or privacy practices are complied with. In particular, such entities would be expected to implement and consistently apply privacy practices that are generally recognized as meeting or exceeding industry or governmental requirements for maintaining the privacy of users. Implementers should inform users where personally identifiable information is expected to be transmitted in a wireless power transfer system and allow users to "opt in" or "opt out" of participation. For instance, such information may be presented to the user when they place a device onto a power transmitter, if the power transmitter is configured to poll for sensitive information from the power receiver.

The invention claimed is:

1. A wireless power transmitter comprising:

a wireless power transfer coil configured to magnetically couple to a wireless power transfer coil of a wireless power receiver to wirelessly transfer power to the wireless power receiver;

an inverter configured to receive input power and generate an output that drives the wireless power transfer coil; and controller and communication circuitry coupled to the inverter and the wireless power transfer coil that controls the inverter to regulate wireless power transfer to the wireless power receiver, wherein the controller and communication circuitry that estimates friendly metal losses associated with wireless power transfer to the wireless power receiver by:

receiving from the wireless power receiver an indication of received power including rectifier voltage and rectifier current of the wireless power receiver associated with the wireless power transfer;

computing a friendly metal power loss based on the received rectifier voltage and the received rectifier current of the wireless power receiver and one or more coefficients corresponding to a baseline wireless power transmission between the wireless power transmitter and the wireless power receiver; and regulating wireless power transfer to the wireless power receiver using the friendly metal power loss.

2. The wireless power transmitter of claim 1 wherein the rectifier voltage is a rectifier output voltage, and the rectifier current is a rectifier output current.

3. The wireless power transmitter of claim 1, wherein the controller and communication circuitry wherein the one or more coefficients corresponding to the baseline wireless power transmission between the wireless power transmitter and the wireless power receiver were derived by:

performing a regression analysis on a received plurality of indications of received power including or derived from corresponding rectifier voltages and rectifier currents of another wireless power receiver associated with another wireless power transfer and a determined plurality of measured power loss values derived therefrom to compute the one or more coefficients.

4. The wireless power transmitter of claim 3 wherein the one or more coefficients include a first coefficient relating to the rectifier current and a second coefficient relating to the rectifier voltage.

5. The wireless power transmitter of claim 4 wherein computing the friendly metal power loss uses an equation having a form:

$$P_{loss} = a \cdot I_{TX}^2 + b \cdot I_{rect}^2 + c \cdot V_{rect}^2$$

where b is the first coefficient relating to the rectifier current, c is the second coefficient relating to the rectifier voltage, a is a coefficient relating to transmitter current, and $I_{TX}$ is the transmitter current.

6. The wireless power transmitter of claim 5 wherein the controller and communication circuitry estimates friendly metal losses by further receiving one or more power loss scaling factors from the wireless power receiver and computing the friendly metal power loss responsive to the one or more power loss scaling factors, wherein the one or more power loss scaling factors are based on pairing between a reference wireless power transmitter or wireless power receiver and an actual wireless power transmitter or wireless power receiver.

7. The wireless power transmitter of claim 1 wherein computing the friendly metal power loss uses an equation having a form:

$$P_{loss} = a \cdot I_{TX}^2 + b \cdot I_{rect}^2 + c \cdot V_{rect}^2$$

where b is a first coefficient relating to the rectifier current, c is a second coefficient relating to the rectifier voltage, a is a coefficient relating to transmitter current, and $I_{TX}$ is the transmitter current.

8. The wireless power transmitter of claim 7 wherein the controller and communication circuitry estimates friendly metal losses by further receiving one or more power loss scaling factors from the wireless power receiver and computing the friendly metal power loss responsive to the one or more power loss scaling factors, wherein the one or more power loss scaling factors are based on pairing between a reference wireless power transmitter or wireless power receiver and an actual wireless power transmitter or wireless power receiver.

9. The wireless power transmitter of claim 1 wherein the controller and communication circuitry estimates friendly metal losses by further receiving one or more power loss scaling factors from the wireless power receiver and computing the friendly metal power loss responsive to the one or more power loss scaling factors, wherein the one or more power loss scaling factors are based on pairing between a reference wireless power transmitter or wireless power receiver and an actual wireless power transmitter or wireless power receiver.

10. A method performed by control circuitry of a wireless power transmitter or a wireless power receiver for estimating friendly metal losses associated with wireless power transfer from the wireless power transmitter to a wireless power receiver, the method comprising:

obtaining an indication of received power including rectifier voltage and rectifier current of the wireless power receiver; and computing a friendly metal power loss based on the indication of rectifier voltage and rectifier current of the wireless power receiver and one or more coefficients corresponding to a baseline wireless power transmission between the wireless power transmitter and the wireless power receiver; and regulating wireless power transfer using the friendly metal power loss;

wherein:

the rectifier voltage is a rectifier output voltage, and the rectifier current is a rectifier output current; and computing the friendly metal power loss uses an equation having a form:

$$P_{loss} = a \cdot I_{TX}^2 + b \cdot I_{rect}^2 + c \cdot V_{rect}^2$$

where b is a first coefficient relating to the rectifier current, c is a second coefficient relating to the rectifier voltage, a is a coefficient relating to transmitter current, and $I_{TX}$ is the transmitter current.

11. The method of claim 10 wherein the rectifier voltage is a rectifier output voltage, and the rectifier current is a rectifier output current.

12. The method of claim 10 wherein the one or more coefficients corresponding to the baseline wireless power transmission between the wireless power transmitter and the wireless power receiver were derived by:

performing a regression analysis on a received plurality of indications of received power and corresponding rectifier voltages and rectifier currents of another wireless power receiver associated with another wireless power transfer and a determined plurality of measured power loss values derived therefrom to compute the one or more coefficients.

13. The method of claim 12 further comprising receiving one or more power loss scaling factors from the wireless power receiver, wherein computing the friendly metal power loss is based on the one or more power loss scaling factors, wherein the one or more power loss scaling factors are based on pairing between a reference wireless power transmitter or wireless power receiver and an actual wireless power transmitter or wireless power receiver.

14. The method of claim 10 further comprising receiving one or more power loss scaling factors from the wireless power receiver, wherein computing the friendly metal power loss is based on the one or more power loss scaling factors, wherein the one or more power loss scaling factors are based on pairing between a reference wireless power transmitter or wireless power receiver and an actual wireless power transmitter or wireless power receiver.

15. A wireless power transmitter comprising:

a wireless power transfer coil configured to magnetically couple to a wireless power transfer coil of a wireless power receiver to wirelessly transfer power to the wireless power receiver;

an inverter configured to receive input power and generate an output that drives the wireless power transfer coil; and controller and communication circuitry coupled to the inverter and the wireless power transfer coil that controls the inverter to regulate wireless power transfer to the wireless power receiver, wherein the controller and communication circuitry estimates friendly metal losses associated with wireless power transfer to the wireless power receiver by:

receiving from the wireless power receiver an indication of received power including rectifier voltage and rectifier current of the wireless power receiver;

computing a friendly metal power loss based on the rectifier voltage and rectifier current of the wireless power receiver and one or more coefficients corresponding to a baseline wireless power transmission between the wireless power transmitter and the wireless power receiver; and regulating wireless power transfer to the wireless power receiver using the friendly metal power loss;

wherein:

the rectifier voltage is a rectifier output voltage, and the rectifier current is a rectifier output current; and computing the friendly metal power loss uses an equation having a form:

$$P_{loss} = a \cdot I_{TX}^2 + b \cdot I_{rect}^2 + c \cdot V_{rect}^2$$

where b is a first coefficient relating to the rectifier current, c is a second coefficient relating to the rectifier voltage, a is a coefficient relating to transmitter current, and $I_{TX}$ is the transmitter current.

16. The wireless power transmitter of claim 15, wherein the one or more coefficients corresponding to the baseline wireless power transmission between the wireless power transmitter and another wireless power receiver were derived by:

performing a regression analysis on a received plurality of indications of received power including or derived from corresponding rectifier voltages and rectifier currents of another wireless power receiver associated with another wireless power transfer and a determined plurality of measured power loss values derived therefrom to compute the one or more coefficients.

17. The wireless power transmitter of claim 16 wherein the controller and communication circuitry estimates friendly metal losses by further receiving one or more power loss scaling factors from the wireless power receiver and computing the friendly metal power loss responsive to the one or more power loss scaling factors, wherein the one or more power loss scaling factors are based on pairing between a reference wireless power transmitter or wireless power receiver and an actual wireless power transmitter or wireless power receiver.

18. The wireless power transmitter of claim 15 wherein the controller and communication circuitry estimates friendly metal losses by further receiving one or more power loss scaling factors from the wireless power receiver and computing the friendly metal power loss responsive to the one or more power loss scaling factors, wherein the one or more power loss scaling factors are based on pairing between a reference wireless power transmitter or wireless power receiver and an actual wireless power transmitter or wireless power receiver.

19. The wireless power transmitter of claim 15 wherein the rectifier voltage is a rectifier output voltage, and the rectifier current is a rectifier output current.

* * * * *